United States Patent
Li et al.

(10) Patent No.: US 7,330,078 B1
(45) Date of Patent: Feb. 12, 2008

(54) APPARATUS AND METHOD FOR LIMITING THE OVERSHOOT AND UNDERSHOOT WHEN TURNING ON THE SPREAD SPECTRUM OF A REFERENCE SIGNAL

(75) Inventors: Gabriel Li, San Francisco, CA (US); Dusan Vecera, Burwood (AU)

(73) Assignee: Cypress Semiconductor Corporation, San Jose, CA (US)

( * ) Notice: Subject to any disclaimer, the term of this patent is extended or adjusted under 35 U.S.C. 154(b) by 111 days.

(21) Appl. No.: 11/300,718

(22) Filed: Dec. 13, 2005

Related U.S. Application Data

(60) Provisional application No. 60/637,719, filed on Dec. 20, 2004.

(51) Int. Cl.
*H03L 7/06* (2006.01)

(52) U.S. Cl. .................. 331/16; 375/376; 327/156

(58) Field of Classification Search .................. 331/16
See application file for complete search history.

(56) References Cited

U.S. PATENT DOCUMENTS

| | | | |
|---|---|---|---|
| 4,843,255 A | 6/1989 | Stuebing | |
| 4,890,065 A | 12/1989 | Laletin | |
| 5,124,597 A | 6/1992 | Stuebing et al. | |
| 5,315,164 A | 5/1994 | Broughton | |
| 5,410,191 A | 4/1995 | Miura | |
| 5,563,605 A | 10/1996 | McEwan | |
| 5,651,035 A * | 7/1997 | Tozun et al. | 375/373 |
| 5,682,114 A | 10/1997 | Ohta | |
| 5,872,807 A * | 2/1999 | Booth et al. | 375/130 |
| 5,933,039 A | 8/1999 | Hui et al. | |
| 5,959,479 A | 9/1999 | Woodward | |
| 6,055,287 A | 4/2000 | McEwan | |
| 6,060,922 A | 5/2000 | Chow et al. | |
| 6,622,254 B1 | 9/2003 | Kao | |
| 6,665,808 B1 | 12/2003 | Schinzel | |
| 6,762,634 B1 | 7/2004 | Hattori | |
| 6,850,554 B1 * | 2/2005 | Sha et al. | 375/140 |
| 7,176,738 B1 * | 2/2007 | Hwang et al. | 327/291 |
| 2003/0151453 A1 | 8/2003 | Laletin | |
| 2003/0229816 A1 | 12/2003 | Meynard | |
| 2005/0071705 A1 | 3/2005 | Bruno et al. | |

OTHER PUBLICATIONS

"Clock Generator for Intel® Grantsdale Chipset", Cypress Semiconductor Corporation, Document #: 38-07666 Rev. *D, Jun. 30, 2005, CY28437, 23 pages.

"Clock Generator for Intel® Grantsdale Chipset", Cypress Semiconductor Corporation, Document #: 38-07664 Rev. *D, Jun. 27, 2005, CY28435, 23 pages.

(Continued)

*Primary Examiner*—Joseph Chang
(74) *Attorney, Agent, or Firm*—Blakely, Sokoloff, Taylor & Zafman LLP

(57) ABSTRACT

Disclosed is a circuit, comprising an input spread spectrum enable signal, a crystal oscillator, a first, second and third sampling flip-flop clocked by the crystal oscillator, configured to sample the input spread spectrum enable signal, and a plurality of control output signals derived from or provided directly from the sampling flip-flops. A method of operating the circuit is further described.

24 Claims, 12 Drawing Sheets

OTHER PUBLICATIONS

"Clock Generator for Intel® Grantsdale Chipset", Cypress Semiconductor Corporation, Document #: 38-07668 Rev. *D, Jun. 13, 2005, CY28439, 23 pages.

Avner Efendovich, Yachin Afek, Coby Sella, Zeev Bikowsky, "Multifrequency Zero-Jitter Delay-Locked Loop", IEEE Journal of Solid-State Circuits, vol. 29, No. 1, Jan. 1994, pp. 67-70.

* cited by examiner

CPU Clock Signal at 100 MHz with -0.5% spread amplitude

EMI Reduction at the Fundamental Frequency 100 MHz

EMI Reduction at the 5th Harmonic Frequency - 500 MHz

EMI Reduction at the 7th Harmonic Frequency - 700 MHz

US 7,330,078 B1

APPARATUS AND METHOD FOR LIMITING THE OVERSHOOT AND UNDERSHOOT WHEN TURNING ON THE SPREAD SPECTRUM OF A REFERENCE SIGNAL

RELATED APPLICATION

This application claims the benefit of U.S. Provisional Application No. 60/637,719, filed Dec. 20, 2004.

TECHNICAL FIELD

The present invention relates generally to electronic circuits and in particular to timing circuits used in computer systems.

BACKGROUND

Spread spectrum clocks are widely used in electronic circuits, and are used in consumer, home, and office electronic products such as personal computers (PCs). Spread spectrum circuits operate by 'spreading' the frequency of a clock signal over a narrow band of frequencies, to reduce the peak Electromagnetic Interferences (EMI).

In a conventional spread spectrum solution, when a counter value changes overshoot occurs at the beginning of the first pulse of the resulting waveform and undershoot occurs at the bottom of the first pulse, as shown in FIG. 1A. The overshoot and undershoot typically start oscillating outside the desired spread range of the system.

FIG. 1B illustrates a block diagram of a conventional phase-locked loop (PLL) synthesizer. PLL synthesizer 100 includes an M-counter 102, a Phase Frequency Detector (PFD)/Charge Pump (CP) 104, a Loop Filter (LF) 106, a Voltage Controlled Oscillator (VCO) 108, an F-counter 110, and an N-counter 112. The input reference signal $F_{REF}$ is divided by the value in M-counter 102 before feeding into PFD/CP 104. Through the PFD/CP 104, the LF 106, and VCO 108, the frequency is multiplied by the value in the N-counter 112. The output frequency $F_{CPU}$ is taken from the VCO 108 after being divided by the value in F-counter 110. In other words, $F_{CPU}$ is calculated using the following equation:

$$F_{CPU} = (F_{REF} * N_{Counter}) / (M_{Counter} * F_{Counter})$$

Conventionally, the M-counter is loaded with values while the value of the N-counter remains the same when performing a feed forward operation; and the N-counter is loaded with values while the value of the M-counter remains the same when performing a feedback operation. In the conventional solution, M- and N-counters are loaded with the spread profile from the ROM. There is no synchronization mechanism between the M- and N-counters. As a result, erroneous pump up and pump down pulses are passed to the charge pump, resulting in the overshoot and undershoot of the VCO clock frequency. In the conventional solution, the PLL loop is never open. The new counter values for M-counter 102, and N-counter 112 are just pushed into the PFD/CP and the PLL must adjust accordingly, resulting in the overshoot and undershoot of FIG. 1A. The letters N, M and F of N-, M-, and F-counters are merely variables that represent the values of the feedback divider (e.g., N-counter), and the reference or feed forward dividers (e.g., F-counter and M-counter). These variables are well known by those of ordinary skill in the art.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1A:
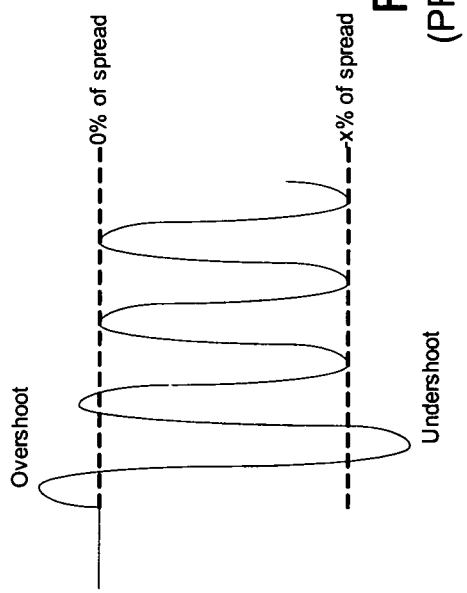
FIG. 1A illustrates a waveform having overshoot and undershoot in a conventional spread spectrum circuit.
Figure 1B:
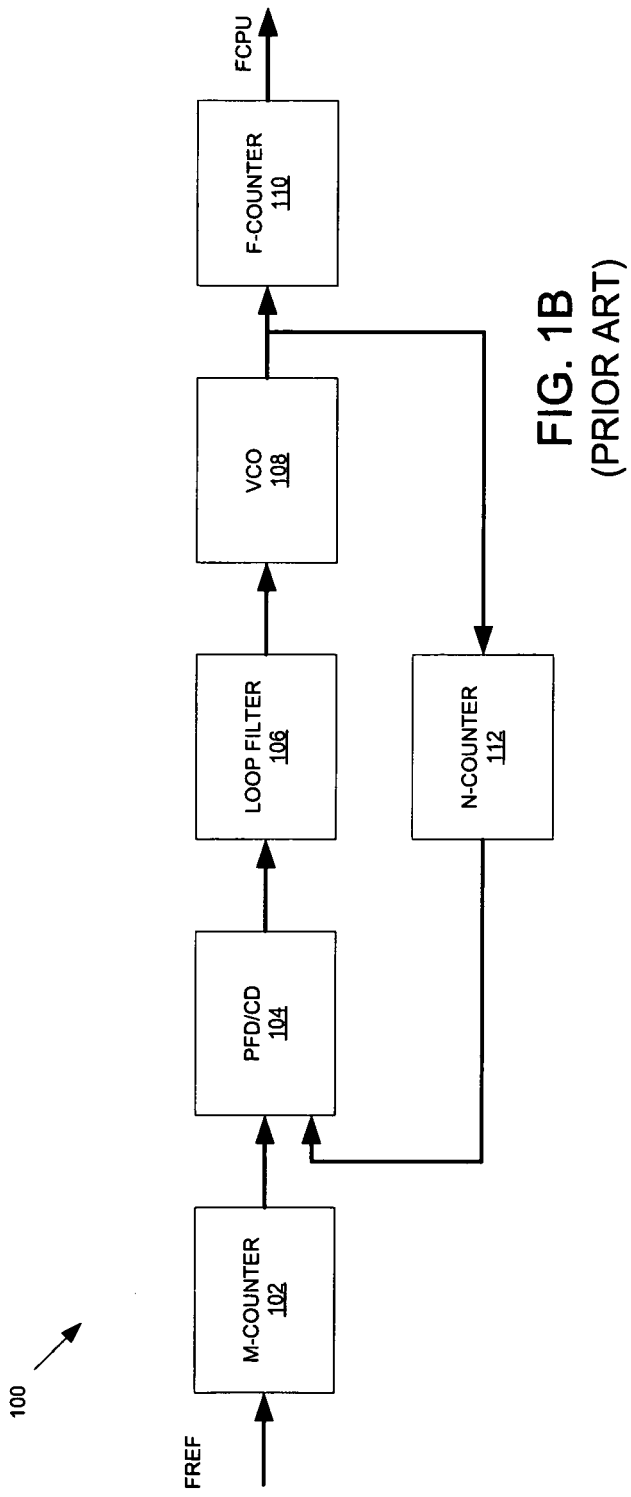
FIG. 1B illustrates a block diagram of a conventional PLL synthesizer.

An apparatus and method are described for limiting overshoot and undershoot when turning on the spread spectrum of a reference signal, for example, a processor clock signal. The apparatus and method may be implemented with logic that interfaces to a PC clock PLL synthesizer to prevent overshoot, for example, to be less than 300 PPM and limit the undershoot to be less than negative 5300 PPM during the turning on of the spread spectrum of a negative 0.5% down spread. In other words, the overshoot and undershoot may be limited to be less than approximately ±300 PPM or ±0.03% of the reference signal, while turning on/off the spread spectrum.

As previously described, conventionally, when turning on the spread spectrum of an input reference signal, the counter values are changed, resulting in overshoot at the beginning of the first pulse of the resulting waveform and undershoot at the bottom of the first pulse. The overshoot and undershoot typically start oscillating outside the pre-determined spread range of the system. There is no synchronization mechanism between the counters used to apply the spread profile and loading the counters while the PLL remains closed results in erroneous pump up and pump down pulses to the charge pump resulting in the overshoot and undershoot of the VCO clock frequency.

Described herein is a spread-control circuit containing an algorithm to be used when a PLL is changing from "spread-off" to "spread-on" and vice versa. During this transition, the spread-control circuit opens the loop, changes the M- and N-values of the M- and N-counters, resets synchronously the M- and N-counters, and consequently closes the loop, forcing the PFD outputs to be zero. This provides minimum assurance that the output reference signal of the PLL is not changing abruptly during the transition.

Using the spread-control circuit does not alter the behavior of the PLL because the loading of the M- and N-counters are performed while the PLL is open (e.g., tri-stated), and subsequently, the phases of the output signals of the M- and N-counters are synchronously aligned before closing the PLL.

In one embodiment, the spread-control circuit includes three sampling flip-flops clocked by the crystal oscillator signal. The spread-control circuit acts as a timing control mechanism for controlling the transition of the PLL from "spread-on" to "spread-off" and vice versa. The control output signals are derived from or are provided directly from the sampling flip-flops. The sampling flip-flops sample the spread spectrum enable signal (e.g., SS_EN). The spread spectrum enable signal may be provided by a serial interface, such as a serial management bus interface (SMBUS). Alternatively, the spread spectrum enable signal may be provided by other components known by those of ordinary skill in the art.

Reference signals, such as clock signals, may generate radiation spikes in the fundamental frequency as well as the harmonic frequencies. By applying a spread spectrum to the signal, energies of the input reference signal can be spread out by modulating the input reference signal with a slower frequency. In other words, the spreading of the input reference signal over a narrow band of frequency reduces the peak EMI. For example, a spread spectrum may be applied to a 200 MHz clock signal, resulting in the 200 MHz signal being modulated with a slower frequency, for example, 33 kHz. In order to modulate the input reference signal by the slower frequency, a spread profile, which is stored in a spread ROM, contains offset values that change the value of the M/N divider (e.g., the values contained in the M- and N-counters that determines the how the input reference signal is multiplied and divided to generate the output reference signal.) The spread profile may substantially form an inverted triangular spread pattern in the output reference signal. Alternatively, the spread profile may substantially form an inverted Lexmark spread pattern in the output reference signal.

The spread profile may be a down-spread or a center-spread. The down- and center-spreads may have a value, expressed as a percentage of the amount of spread that is applied to the input reference signal. For example, a down-spread of negative 0.5%, having an inverted triangular spread profile may be applied to the input reference signal to form an inverted triangular spread pattern in the output reference signal. A down-spread of negative 0.5% results in an output frequency of 200 MHz, having peaks values at 200 MHz and 199 MHz (200 Mhz−((0.5%)*(200 MHz)). It should be noted that in this example, the resulting waveform of the output reference signal (e.g., inverted triangular spread pattern) will start at 200 MHz and decrease in frequency down to the first peak value of 199 MHz at the bottom of a first pulse of the resulting waveform (e.g., an initial negative frequency slope), then increase in frequency up to a second peak value of 200 MHz, and decrease back down to a third peak value of 199 MHz of a second pulse, repeating as long as the spread spectrum is turned on. The frequency between the first peak value and the third peak value is the spread frequency, for example, a spread frequency of 33 kHz. Similarly, an exemplary center-spread profile of negative 0.5% will decrease in frequency by negative 0.25% of the input frequency to the first peak value of the first pulse, and will increase up to positive 0.25% of the input frequency to the second peak value, repeating as long as the spread spectrum is turned on.

In one embodiment, the spread-control circuit, implementing the method described herein, may be used to reduce the peak energy in a clock signal for a processor at the fundamental and harmonic frequencies. Alternatively, this algorithm may be applied in reducing the radiation of a reference signal, such as a crystal output signal, in other physical chips known by those of ordinary skill in the art.

Figure 2:
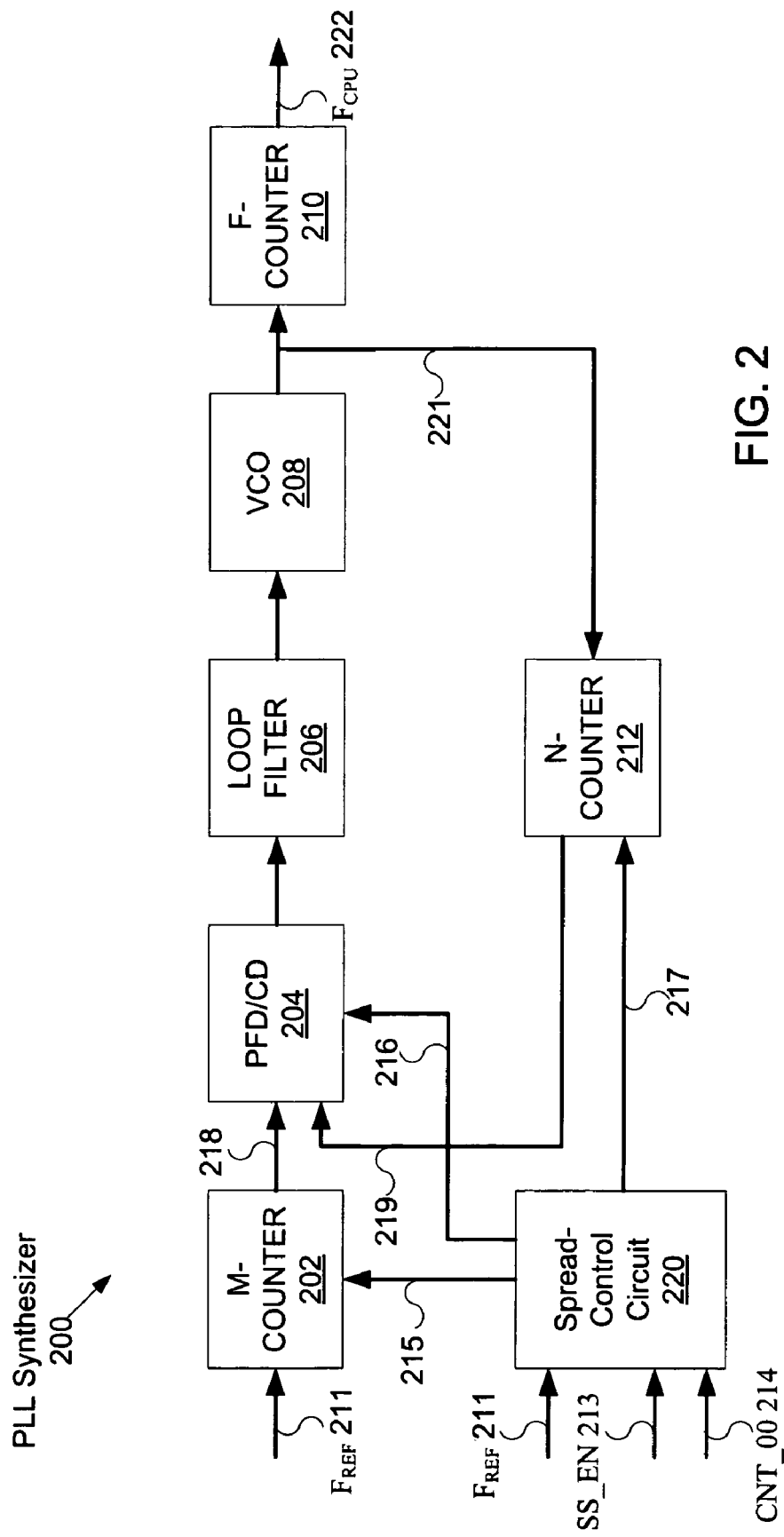
FIG. 2 illustrates a block diagram of an embodiment of a PLL synthesizer including a spread-control circuit.

FIG. 2 illustrates a block diagram of an embodiment of a PLL synthesizer including a spread-control circuit. PLL synthesizer 200 includes an M-counter 202, Phase Frequency Detector (PFD)/Charge Pump (CP) 204 coupled to the M-counter 202; Loop Filter (LF) 206 coupled to the PFD/CP 204; Voltage Controlled Oscillator (VCO) 208 coupled to the LF 206; F-counter 210 coupled to the VCO 208; and N-counter 212 coupled to the VCO 208 and PFD/CD 204. PLL synthesizer 200 is coupled to a spread-control circuit 220. In one embodiment, the spread-control circuit 220 is coupled to the M-counter 202, the PFD/CP 204, and the N-counter 212. Spread-control circuit 220 may receive one or more of the following inputs: input reference signal $F_{REF}$ 211; spread spectrum enable signal 213 (e.g., SS_EN); and initial state signal 214 (e.g., CNT_00).

In one embodiment, the input reference signal $F_{REF}$ 211 may be an input reference signal received by a crystal oscillator. Alternatively, input reference signal $F_{REF}$ 211 may be an input reference signal received by other components known by those of ordinary skill in the art. In one embodiment, the input reference signal $F_{REF}$ 211 is received by a crystal oscillator and output reference signal $F_{CPU}$ 222 is a clock signal. Alternatively, the output reference signal $F_{CPU}$ 222 may be a processor clock signal.

Spread-control circuit 220 outputs control signals to the M-counter 202 on line 215, to the PFD/CP 204 on line 216, and to N-counter 212 on line 217. The input reference signal $F_{REF}$ 211 is divided by the value of M-counter 202 on line 218 before feeding the frequency into PFD/CP 204. Through the PFD/CP 204, the LF 206, and VCO 208, the frequency is multiplied by the value of the N-counter 212 on line 219. The output reference signal $F_{CPU}$ 222 is taken from the VCO 208 on line 221 after being divided by the value in F-counter 210. In other words, the output reference signal $F_{CPU}$ 222 is calculated using the following equation:

$$F_{CPU} = (F_{REF} * N_{Counter})/(M_{Counter} * F_{Counter})$$

Figure 3:
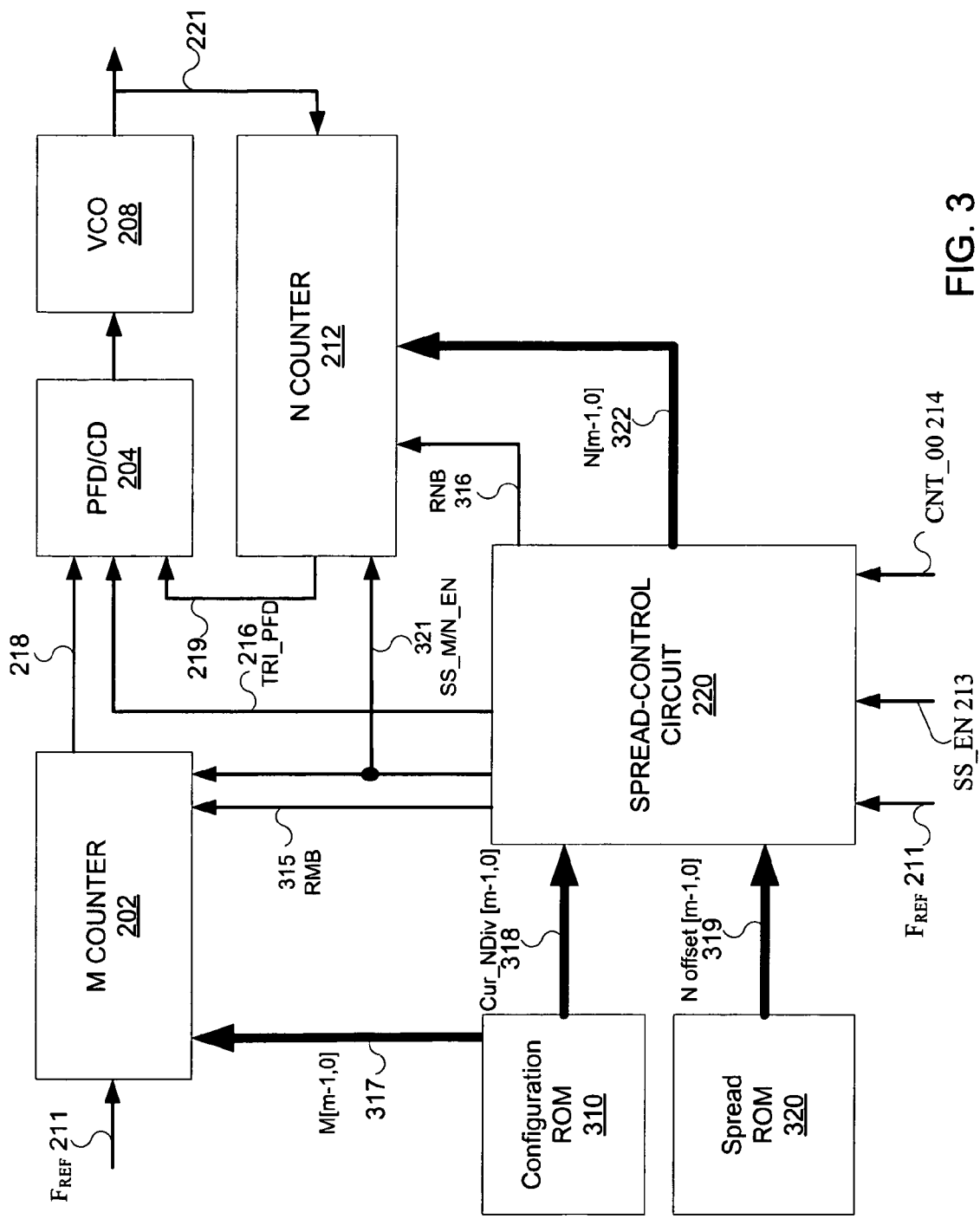
FIG. 3 illustrates a block diagram of an embodiment of a spread-control circuit coupled to the PLL synthesizer of FIG. 2, to a configuration read only memory (ROM), and to a spread ROM.

FIG. 3 illustrates a block diagram of an embodiment of a spread-control circuit coupled to the PLL synthesizer 200 of FIG. 2, to a configuration ROM 310, and to a spread ROM 320. Spread-control circuit 220 may output one or more of the following output control signals: a phase frequency detector (PFD) control signal 216 (e.g., TRI_PFD) to open and close the PLL; a first counter reset signal 316 to activate and release the N-counter 212 (e.g., RNB); a second counter reset signal 315 to activate and release the M-counter 202 (e.g., RMB), and a divider control signal 321 (e.g., SS_M/N_EN) to load the N-counter 212 with a first base value and the M-counter 202 with a first base value. Spread-control circuit 220 receives one or more base values from configuration ROM 310 on line 318 (e.g., Cur_NDiv[m−1,0]). Configuration ROM 310 also outputs one or more base values to the M-counter 202 on line 317 (e.g., M[m−1,0]). Spread-control circuit 220 receives a plurality of offset values from a spread ROM 320 on line 319 (e.g., N offeset[m−1,0]) to be added to the base values of the configuration ROM 310 received by the spread-control circuit 220 on line 318. The added values, containing the base values and the offset values, are output from the spread-control circuit 220 on line 322 to the N-counter 212. Alternatively, when the spread operation is not operating the base values received on line 318 are output on line 322 to the N-counter 212 using a bypass feature described with respect to FIG. 4. The counter values of N-counter 212 received on line 322 are updated continually, every complete cycle, or in other words, every FV pulse, as described below. The values are clocked out sequentially from the spread ROM 320 by the address lines of the spread spectrum address counter 430 on line 404, as described with respect to FIG. 4.

Figure 4:
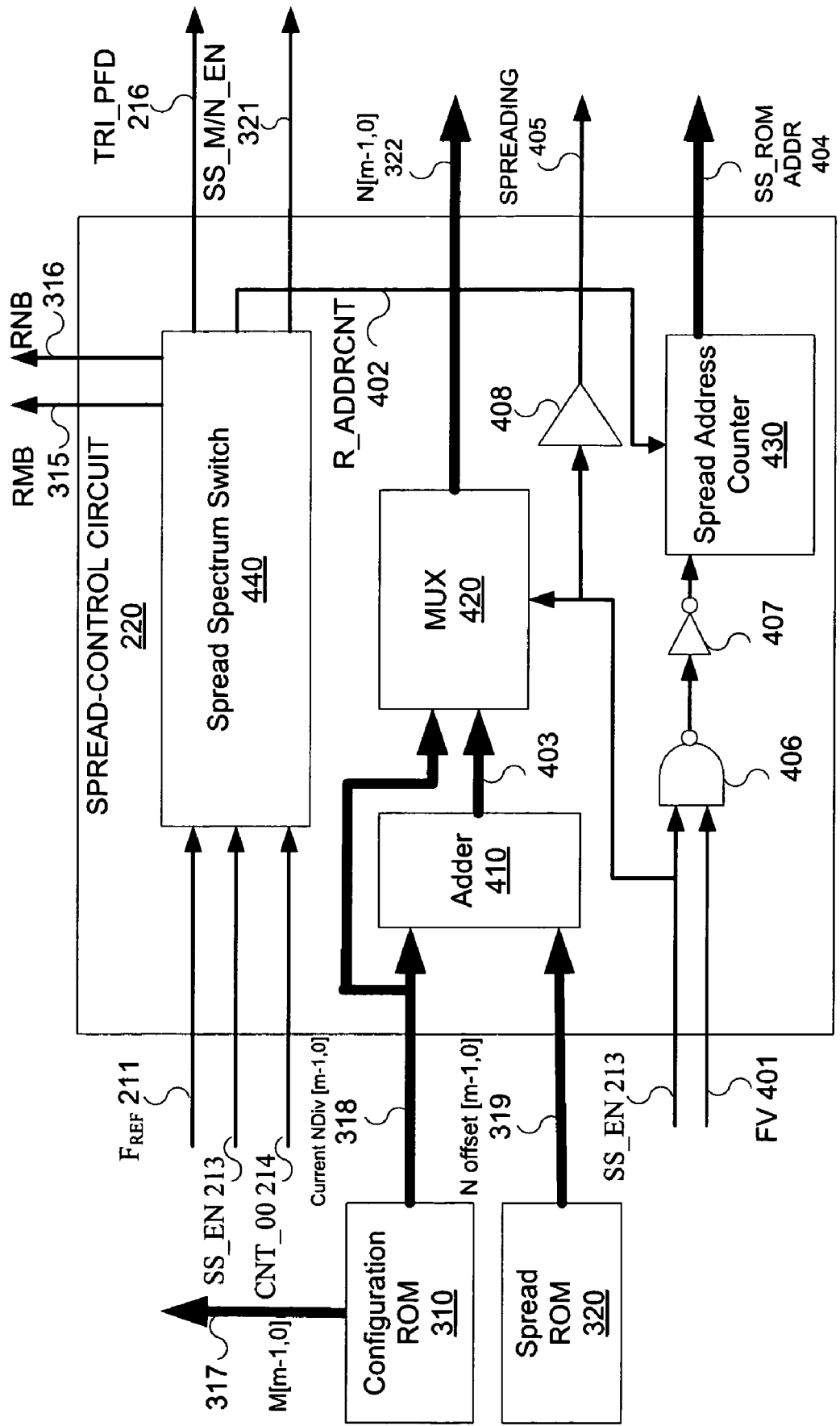
FIG. 4 illustrates a block diagram of one embodiment of the spread-control circuit of FIG. 2.

FIG. 4 illustrates a block diagram of one embodiment of the spread-control circuit of FIG. 2. In one embodiment, spread-control circuit 220 includes a spread spectrum switch 440, an adder 410, a MUX 420, and a spread address counter 430. The spread spectrum switch may receive as inputs, the input reference signal $F_{REF}$ 211, spread spectrum enable signal 213 (e.g., SS_EN), and initial state signal 214 (e.g., CNT_00). The spread spectrum switch 440 may output one or more of the following output control signals: phase frequency detector (PFD) control signal 216 (e.g., TRI_PFD) to open and close the PLL; counter reset signal 316 to activate and release the reset of N-counter 212 (e.g., RNB); second counter reset signal 315 to activate and release the reset of M-counter 202 (e.g., RMB), divider control signal 321 (e.g., SS_M/N_EN) to load the N-counter 212 with a first base value and the M-counter 202 with a first base value; and address counter reset signal 402 to activate and release the spread address counter 430.

The spread address counter 430, which receives the address counter reset signal 402 from the spread spectrum switch 440, also receives as a clock input a gated signal including the spread spectrum enable signal 213 (e.g., SS_EN) and an overflow bit FV 401 of the N-counter 212. In other words, when the spread control circuit 220 receives the spread spectrum enable signal 213, meaning the spread operation is on, and receives the overflow bit FV 401, the spread address counter increments by 1, assuming the address counter reset signal 402 is released (e.g., deactivated). The spread address counter 430 outputs the current address of the spread ROM 320 on line 404. In one embodiment, the gated signal may be produced from inverter 407, which receives an input from the output of NAND gate 406, which receive the spread spectrum enable signal 213 (e.g., SS_EN) and the overflow bit FV 401 of the N-counter 212. Alternatively, other logic, known by those of ordinary skill in the art, may be used to provide a clock signal to the spread address counter 430.

Adder 410 receives as inputs, the one or more base values from the configuration ROM 310 on line 318, and the plurality of offset values from the spread ROM 320 on line 319. The adder 410 sums the base value received on line 318 with the offset value received on line 319, and outputs the added value to the MUX 420 on line 403. MUX 420 receives as inputs, the one or more base values from the configuration ROM 310 on line 318 and the added values received from the adder 410. The MUX 420 also receives a control signal, spread spectrum enable signal 213 from spread spectrum switch 440 to determine whether to use the added values received from the adder 410 on line 403 or the one or more base values received from the configuration ROM 310 received on line 403. The MUX 420 outputs the added values on line 322 to be loaded into the N-counter 212 on line 322 when the spread operation is on, or in other words, when the spread spectrum enable signal 213 is activated. The MUX 420 outputs the base values received on line 318 to be loaded into the N-counter 212 on line 322 when the spread operation is off, or in other words, when the spread spectrum enable signal 213 is deactivated. The MUX 420 and spread spectrum enable signal 213 create a bypass feature in spread-control circuit 220 to allow the spread spectrum operation to be bypassed.

Figure 5:
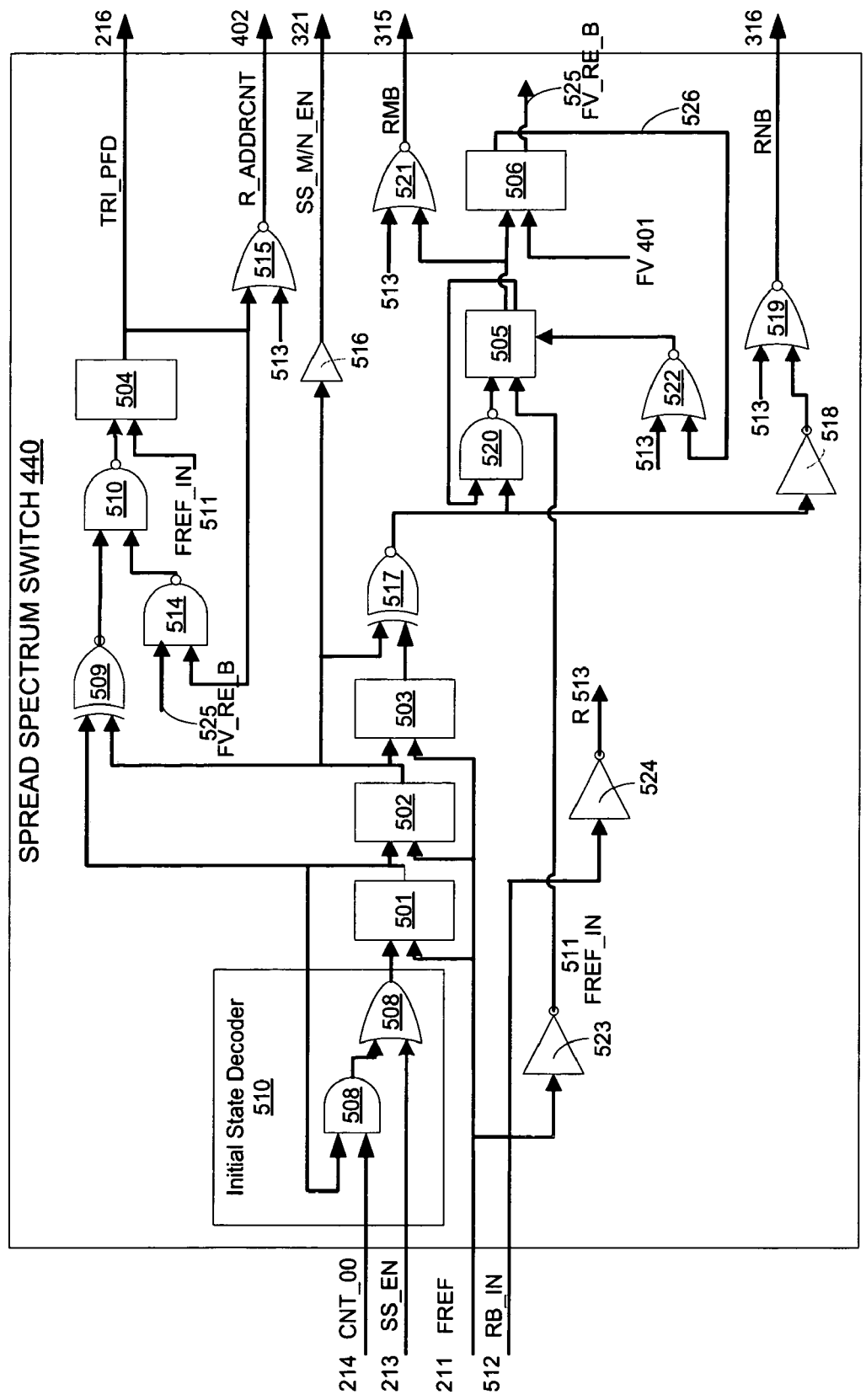
FIG. 5 illustrates a gate-level block diagram of one embodiment of a spread spectrum switch of the spread-control circuit.

FIG. 5 illustrates a gate-level block diagram of one embodiment of a spread spectrum switch of the spread-control circuit. In one embodiment, spread spectrum switch 440 includes three sampling flip-flops 501, 502, and 503, clocked by the input reference signal $F_{REF}$ 211. In one embodiment, the input reference signal $F_{REF}$ 211 may be an input reference signal received by a crystal oscillator. Alternatively, input reference signal $F_{REF}$ 211 may be an input reference signal received by other components known by those of ordinary skill in the art. In one embodiment, the input reference signal $F_{REF}$ 211 is received by a crystal oscillator.

The sampling flip-flops 501, 502, and 503 produce control output signals to control the operations of the spread spectrum operation as discussed below. Sampling flip-flops 501, 502, and 503 sample the spread spectrum enable signal 213 (e.g., SS_EN), and generate a plurality of output control signals. In one embodiment, before being sampled by the first sampling flip-flop 501, spread spectrum enable signal 213 may be input into an initial state decoder 510. Alternatively, the spread spectrum enable signal 213 may be directly input into the first sampling flip-flop 501.

In one embodiment, the initial state decoder 510 receives the spread spectrum enable signal 213 and an initial state signal 214 (e.g., CNT_00). The initial state signal 214 may be received from an address decoder that decodes the initial state of the spread address counter 430. The initial state of the spread address counter 430 is when the spread address counter 430 is at a 00 count or when the spread address counter 430 is reset. Alternatively, other processes known to those skilled in the art may be used to detect the initial state of the spread address counter 430 and to provide an initial state signal 214 (e.g., CNT_00).

In one embodiment, the initial state decoder 510 comprises AND gate 507 and OR gate 508. The AND gate 507 receives the initial state signal 214 and a feedback signal from the output of the first sampling flip-flop 501. The OR gate 508 receives the spread spectrum enable signal 213 and the output signal from the AND gate 507, and outputs a signal to the input of the first sampling flip-flop 501. Alternatively, other logic known by those skilled in the art may be implemented to decode the initial state signal 214 to ensure that the spread spectrum operation will begin with the spread spectrum address counter 430 being in an initial state or having a 00 count.

The output signal of the first sampling flip-flop 501 is output into the input of the second sampling flip-flop 502 and into a not exclusive or (NXOR) gate 509. The logic of NXOR gate 509 compares two input bits on the two output signals of the first and second sampling flip-flops 501 and 502 and generates one output bit to be input into not AND (NAND) gate 510. If the output signals from the sampling flip-flops 501 and 502 are the same, the resulting output signal is a logical one, if the output signals are different, then the resulting output signal is a logical zero. The output of NAND gate 510 inputs into flip-flop 504. Flip-flop 504 is clocked using the inverted input reference signal 511, which is created using inverter 523, receiving as an input the input reference signal $F_{REF}$ 211. In other words, flip-flop 504 is clocked on a falling edge of the input reference signal $F_{REF}$ 211.

Flip-flop 504 outputs the PFD control signal 216 (e.g., TRI_PFD) to open and close the PLL synthesizer 200. The PFD control signal 216 is feedback to NAND gate 514. NAND gate 514 receives as input, the PFD control signal 216 and an inverted reset M-counter signal 525 (e.g., FV_RE_B) synchronized to overflow bit signal FV 401. Inverted reset M-counter signal 525 is the inverted output from flip-flop 506, which is clocked by overflow bit signal FV 401. The output of NAND gate 514 is input into NAND gate 510. The inverted overflow bit 525 may be used to deactivate the PFD control signal 216 for closing the PLL synthesizer 200 after loading the N-counter 212 and the M-counter 202 with the base values of the configuration ROM 310. Loading the base values of the configuration ROM 310 into the N-counter 212 and the M-counter 202 while the PLL synthesizer 200 provides minimum assurance that the output reference signal $F_{CPU}$ 222 of the PLL synthesizer 200 is not changing abruptly during the transition of turning the spread spectrum on and off. This synchronization or timing mechanism between the M- and N-counters 202 and 212 prevents erroneous pump up and pump down pulses to be passed to the charge pump of the PFD/CP 204, which ultimately limits the overshoot and undershoot of the VCO clock frequency.

The spread spectrum switch 440 produces an output control signal, address counter reset signal 402, which resets spread address counter 430. In one embodiment, NOR gate 515 receives a reset signal 513 (e.g., R) and the PFD control signal 216. Reset signal 513 (e.g., R) is created using inverter 524, receiving as an input the inverted reset signal 512 (e.g., RB_IN). The inverted reset signal 512 is the chip reset. The chip reset may be generated by a power reset circuit. Alternatively, the chip reset may be generated by other functional blocks of the chip known by those of ordinary skill in the art. NOR gate 515 activates the address counter reset signal 402 when the PLL synthesizer 200 has been opened (e.g., tri-stated) and the reset signal 513 is activated. The NOR gate 515 deactivates the address counter reset signal 402 when the PLL synthesizer 200 has been closed (e.g., not tri-stated) or when the reset signal 513 is activated. Alternatively, other logic or circuitry known by those skilled in the art may be used to produce the address counter reset signal 402 to reset the spread spectrum address counter 430.

The spread spectrum switch 440 produces an output control signal, divider control signal 321 (e.g., SS_M/N_EN), to load the N-counter 212 with a first base value and the M-counter 202 with a first base value while the PLL synthesizer 200 is open (e.g., tri-stated). In one embodiment, the output signal of the second sampling flip-flop 502 generates the divider control signal 321 (e.g., SS_M/N_EN). The divider control signal 321 may also be buffered by buffer 516. Alternatively, other logic or circuitry known by those skilled in the art may be used to produce the divider control signal 321 to load the N-counter 212 with the first base value and the M-counter 202 with the first base value while the PLL synthesizer 200 is open (e.g., tri-stated).

The spread spectrum switch 440 produces an output control signal, first counter reset signal 316 (e.g., RNB), to activate and deactivate the reset the N-counter 212. In one embodiment, the output of the third sampling flip-flop 503 is output into NXOR gate 517. The NXOR gate 517 compares the output signals of the second and third sampling flip-flops 502 and 503, and generates one output signal to be input into inverter 518. If the signals output from the second and third sampling flip-flops 502 and 503 are the same, the resulting output signal is a logical one, if the output signals are different, then the resulting output signal is a logical zero. NOR gate 519 receives, as its inputs, the reset signal 513 (e.g., R) and the output of the inverter 518, and outputs the first counter reset signal 316 (e.g., RNB). NOR gate 519 releases or deactivates the first counter reset signal 316 when either of the inputs are asserted. Alternatively, other logic or circuitry known by those skilled in the art may be used to produce the first counter reset signal 316 to activate and release the reset of N-counter 212.

The spread spectrum switch 440 produces an output control signal, second counter reset signal 315 (e.g., RMB) to activate and deactivate the reset the M-counter 202. In one embodiment, NAND gate 520 receives as inputs, the output of the XNOR gate 517 and an inverted feedback signal from flip-flop 505. The output of NAND gate 520 outputs to the input of flip-flop 505. The input of flip-flop 505 is clocked by inverted input reference signal 511. Flip-flop 505 outputs to NOR gate 521, which also receives as an input, reset signal 513 (e.g., R). NOR gate 521 produces second counter reset signal 315 (e.g., RMB). Flip-flop 505 also outputs to the input of flip-flop 506, which is clocked by the overflow bit signal FV 401 of N-counter 212. Flip-flop 506 outputs an inverted reset M-counter signal 525 (e.g., FV_RE_B) used to activate/deactivate PFD control signal 216 (e.g., TRI_PFD) to open/close the PLL, and non-inverted output 526 to be used to activate/deactivate second counter reset signal 315 (e.g., RMB) to activate and deactivate the reset the M-counter 202. In one embodiment, the overflow bit signal FV 401 is the feedback sign from the output of the N-counter 212 transmitted to the PFD/CP 204. Flip-flop 506 provides the non-inverted output 526 to the input of NOR gate 522, which also receives as an input, reset signal 513 (e.g., R). NOR gate 522 outputs to activate or deactivate the reset of flip-flop 505. Alternatively, other logic or circuitry known by those skilled in the art may be used to produce the second counter reset signal 315 to activate and release the reset of M-counter 202.

In one embodiment, the spread spectrum switch 440 may be designed using logic, as described with respect to FIG. 5. Alternatively, the spread spectrum switch 440 may be implemented in one or more field programmable gate array (FPGA) or other using other logical circuits known to those of ordinary skill in the art.

In one embodiment, the spread-control circuit 220 may be used to synchronously open the PLL synthesizer 200, synchronously load the M- and N-counters 202 and 212, synchronously align phases of the output signals of the M- and N-counters 202 and 212, and synchronously close the PLL synthesizer and increment a spread address counter. The preceding operations may be performed by synchronously generating the plurality of output control signals, for example, phase frequency detector (PFD) control signal 216 (e.g., TRI_PFD) to open and close the PLL, first counter reset signal 316 to activate and release the N-counter 212 (e.g., RNB), second counter reset signal 315 to activate and release the M-counter 202 (e.g., RMB), divider control signal 321 (e.g., SS_M/N_EN) to load the N-counter 212 with the first base value and the M-counter 202 with the first base value, and address counter reset signal 402 to activate and release the spread address counter 430. The method to perform such operations are described below, including the timing and sequence of clocking events associated with the generation of these output control signals of the spread-control circuit 220.

In one embodiment, the PLL synthesizer 200 may be a serial ATA (SATA) PLL. The switch and spread logic of spread-control circuit 220 may control the behavior of the SATA PLL when the SATA PLL changes to/from spread. The spread-control circuit 220 of SATA PLL may open the PLL, change the M- and N-counter values to the first base values, reset the M- and N-counters synchronously, and subsequently to align the phase of their outputs, close the PLL. This provides minimum assurance that the output frequency of the PLL is not changing abruptly during the transition. In other words, no erroneous pump up and pump down pulses are passed to the charge pump of the PFD/CP 204, limiting the overshoot and undershoot of the VCO clock frequency. Alternatively, the PLL synthesizer may be used in connection with other circuits known by those of ordinary skill in the art to generate an output reference signal, such as output reference signal $F_{CPU}$ 222. In one embodiment, output reference signal $F_{CPU}$ 222 may be a clock signal. Alternatively, the clock signal may be a processor clock signal.

Figure 6:
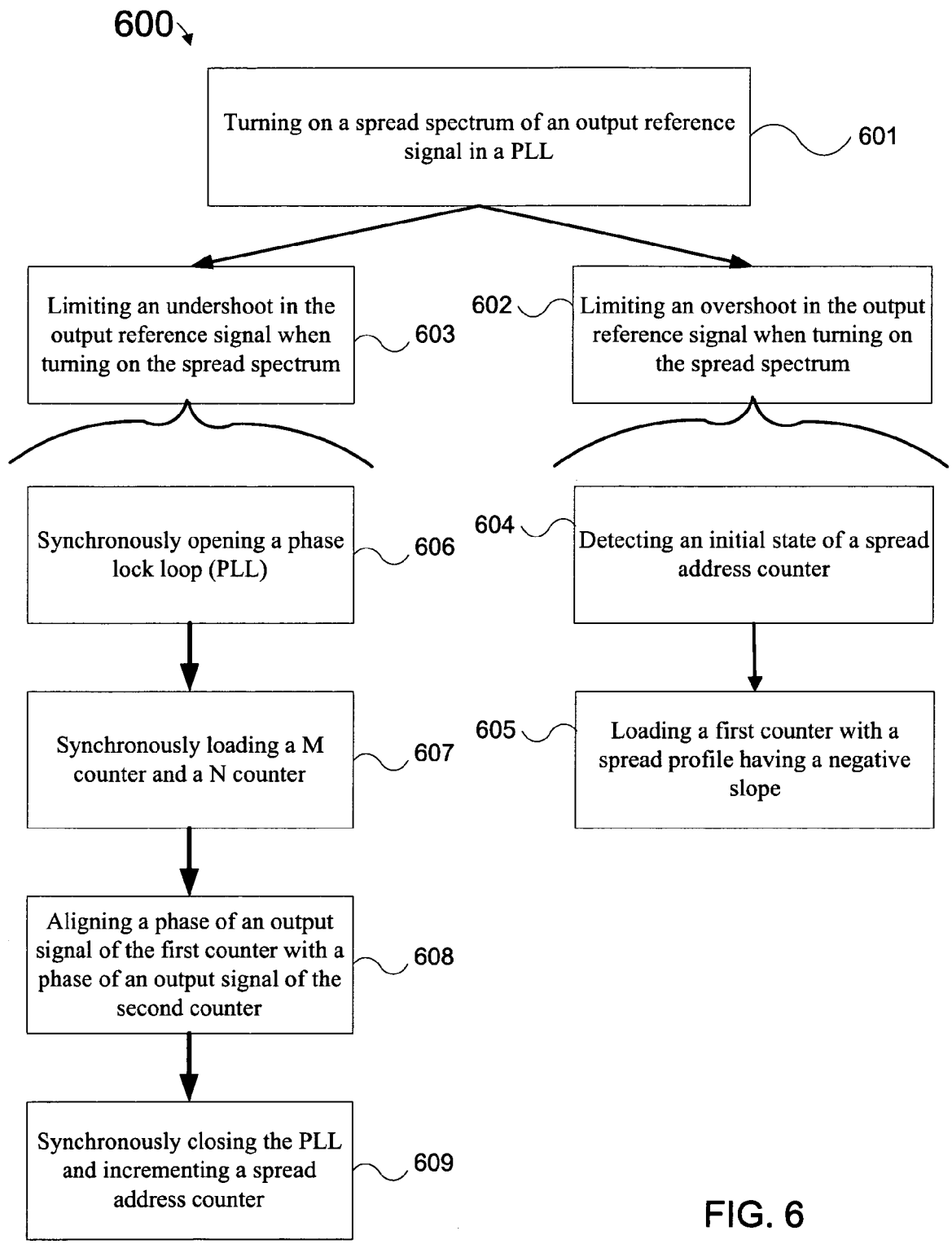
FIG. 6 illustrates a flow chart diagram of one embodiment of a method for limiting undershoot and overshoot in an output reference signal.

FIG. 6 illustrates a flow chart diagram of one embodiment of a method for limiting undershoot and overshoot in an output reference signal. In one embodiment, method 600 includes turning on a spread spectrum of an output reference signal in a PLL, operation 601; limiting an overshoot in the output reference signal when turning on the spread spectrum, operation 602; and limiting an undershoot in the output reference signal when turning on the spread spectrum, operation 603. Alternatively, method 600 includes turning on a spread spectrum of an output reference signal in a PLL, operation 601; and limiting an overshoot in the output reference signal when turning on the spread spectrum, operation 602. Alternatively, method 600 includes turning on a spread spectrum of an output reference signal in a PLL, operation 601; and limiting an undershoot in the output reference signal when turning on the spread spectrum, operation 603.

In one embodiment, the output reference signal is a clock signal. The clock signal may be a PC clock signal. Alternatively, the output reference signal is a reference signal used in other components known by those of ordinary skill in the art.

Limiting the overshoot in the output reference signal when turning on the spread spectrum in operation 602 may further include detecting an initial state of a spread address counter, operation 604; and loading a first counter with a spread profile where the spread profile causes an initial negative frequency slope in the output reference signal, operation 605.

In one embodiment, the method of limiting the overshoot may achieve having the overshoot be less than approximately 300 parts per million (PPM). PPM indicates the amount of frequency deviation from a specified frequency. Alternatively, the method of limiting the overshoot may achieve substantially no overshoot (e.g., 0 PPM).

Limiting the undershoot in the output reference signal when turning on the spread spectrum in operation 603 may further include synchronously opening the PLL, operation 606; synchronously loading a first counter and a second counter of the PLL, operation 607; aligning a phase of an output signal of the first counter with a phase of an output signal of the second counter, operation 608; and synchronously closing the PLL and incrementing a spread address counter, operation 609.

In one embodiment, the method of limiting the undershoot may achieve having the undershoot be less than approximately negative 5300 PPM. In other words, the undershoot may be limited to be less than approximately negative 300 PPM or ±0.03% below the spreading profile of the reference signal. Alternatively, the method of limiting the undershoot may achieve substantially no undershoot. It should be noted that in determining the undershoot, the undershoot value includes the decrease in frequency due to the spreading. For example, a negative 0.5% down-spread of an output reference signal without any undershoot would be negative 5000 PPM (e.g., −0.5%). Alternatively, substantially no undershoot may be negative 7500 PPM for a negative 0.75% down-spread, or negative 2500 PPM for a 0.5% center-spread.

Figure 7:
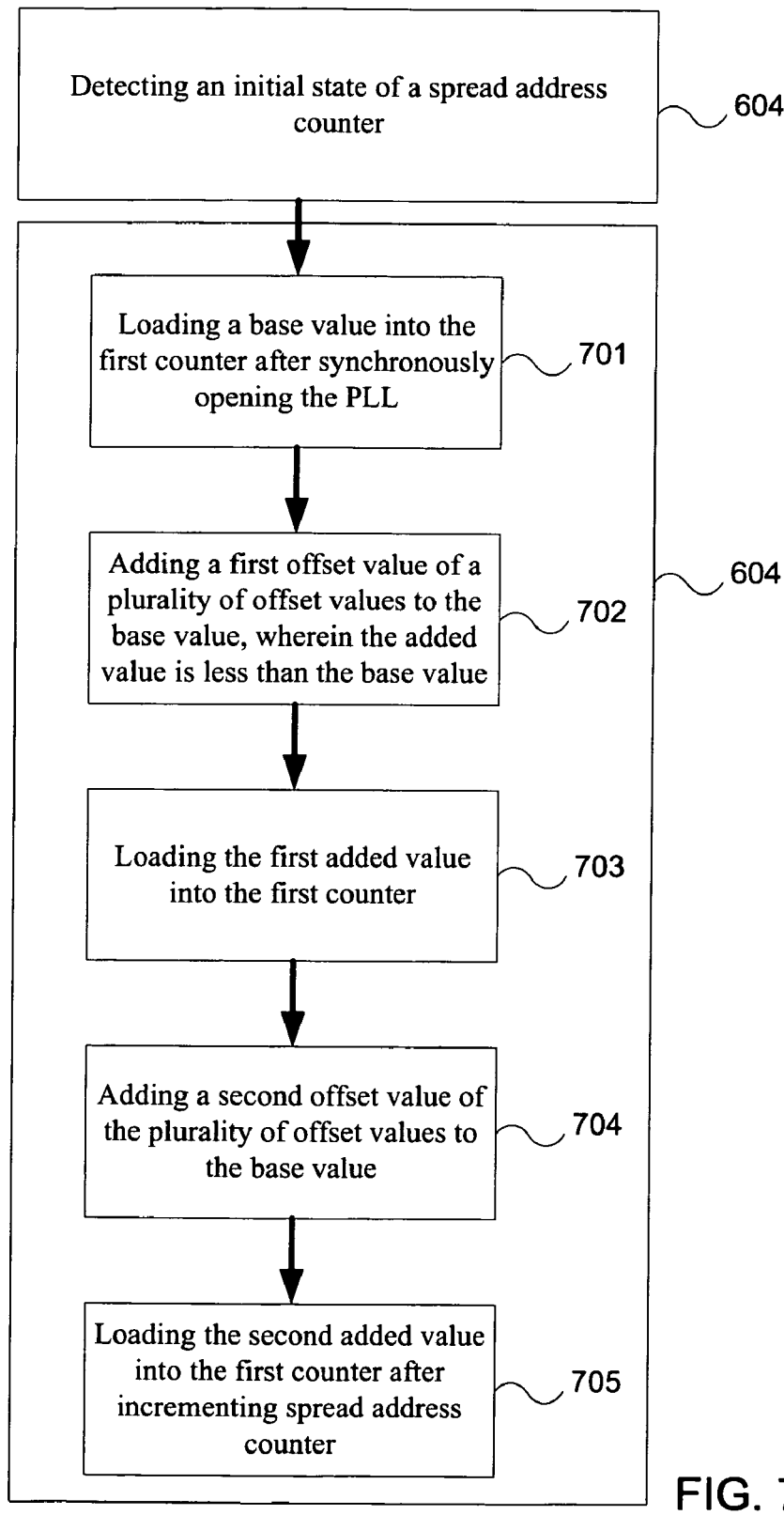
FIG. 7 illustrates another embodiment of a method for limiting overshoot in the output reference signal.

FIG. 7 illustrates another embodiment of a method for limiting overshoot in the output reference signal. Method 700 includes detecting an initial state of a spread address counter, operation 604; and loading a first counter with a spread profile, where the spread profile causes an initial negative frequency slope in the output reference signal, operation 605. In one embodiment, loading a first counter with a spread profile in operation 605 of method 700 may further include loading a base value into the first counter after synchronously opening the PLL, operation 701; adding a first offset value of a plurality of offset values to the base value, where the first offset value decreases a frequency of the output reference signal, operation 702; loading the first added value into the first counter, operation 703; adding a second offset value of the plurality of offset values to the base value, where the second offset value decreases the frequency of the output reference signal, operation 704; and loading the second added value into the first counter after incrementing spread address counter, operation 705.

In another embodiment, method 700 may further include the operations of synchronously opening the PLL, operation 606; synchronously loading a first counter and a second counter of the PLL, operation 607; aligning a phase of an output signal of the first counter with a phase of an output signal of the second counter, operation 608; and synchronously closing the PLL and incrementing a spread address counter, operation 609. Alternatively, method 700 may further include operations 801-813 of method 800, as described below.

In one embodiment, the plurality of offset values substantially form an inverted triangular spread pattern in the output reference signal. In another embodiment, the plurality of offset values substantially form an inverted Lexmark spread pattern in the output reference signal. Alternatively, the plurality of offset values substantially may form other spread patterns known by those of ordinary skill in the art.

Figure 8:
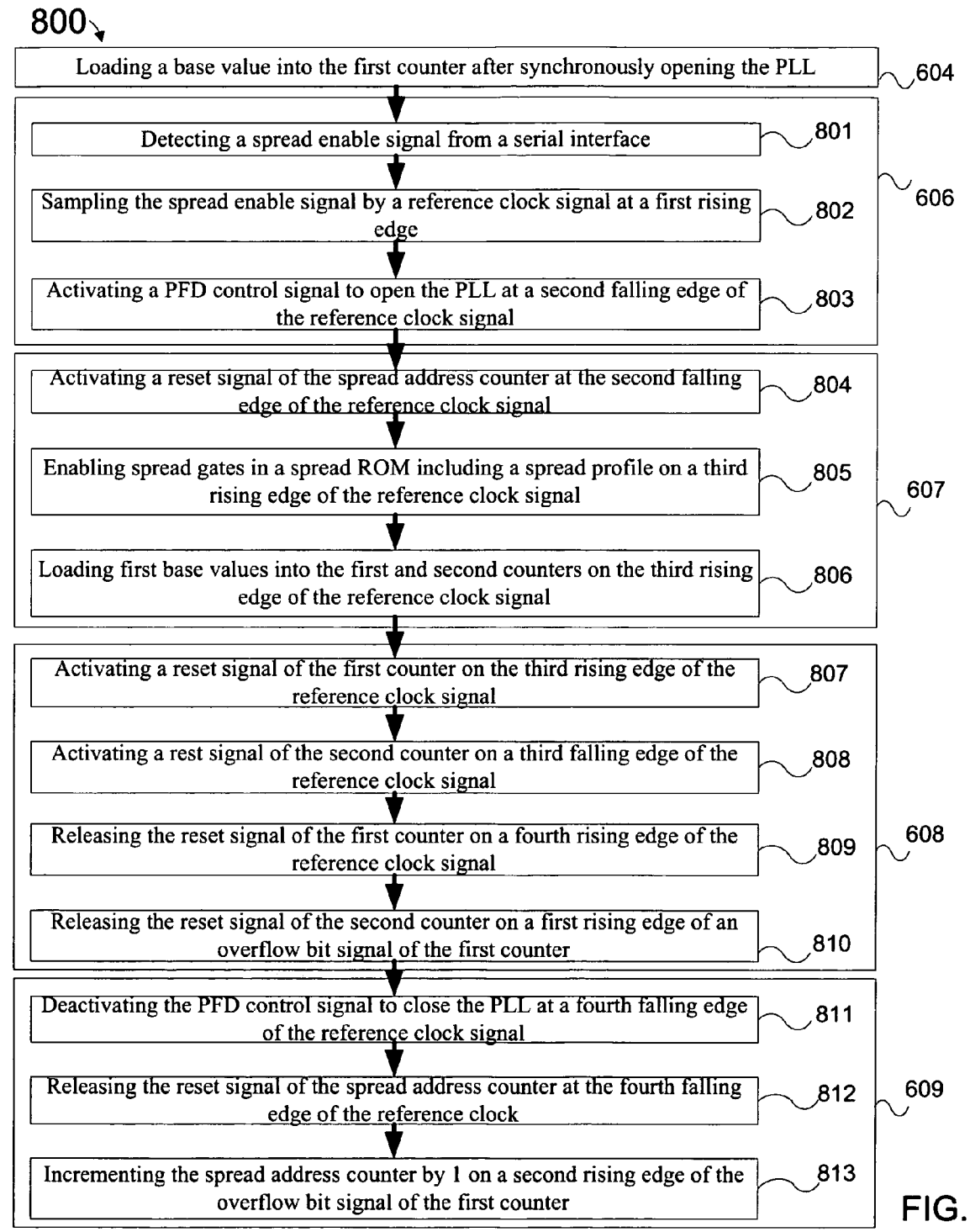
FIG. 8 illustrates another embodiment of a method for limiting undershoot in the output reference signal.

FIG. 8 illustrates another embodiment of a method for limiting undershoot in the output reference signal. Method 800 includes loading a base value into the first counter after synchronously opening the PLL, operation 604; synchronously opening the PLL, operation 606; synchronously loading a first counter and a second counter of the PLL, operation 607; aligning a phase of an output signal of the first counter with a phase of an output signal of the second counter, operation 608; and synchronously closing the PLL and incrementing a spread address counter, operation 609.

In one embodiment, synchronously opening the PLL, operation 606 of method 800, may further include detecting a spread enable signal from a serial interface, operation 801; sampling the spread enable signal by a reference clock signal at a first rising edge, operation 802; and activating a PFD control signal to open the PLL at a second falling edge of the reference clock signal, operation 803.

In one embodiment, synchronously loading a first counter and a second counter of the PLL, operation 607 of method 800, may further include activating a reset signal of the spread address counter at the second falling edge of the reference clock signal, operation 804; enabling spread gates in a spread ROM including a spread profile on a third rising edge of the reference clock signal, operation 805; and loading first base values into the first and second counters on the third rising edge of the reference clock signal, operation 806.

In one embodiment, aligning a phase of an output signal of the first counter with a phase of an output signal of the second counter, operation 608 of method 800, may further include activating a reset signal of the first counter on the third rising edge of the reference clock signal, operation 807; activating a rest signal of the second counter on a third falling edge of the reference clock signal, operation 808; releasing the reset signal of the first counter on a fourth rising edge of the reference clock signal, operation 809; and releasing the reset signal of the second counter on a first rising edge of an overflow bit signal of the first counter, operation 810.

In one embodiment, synchronously closing the PLL and incrementing a spread address counter, operation 609 of method 800, may further include deactivating the PFD control signal to close the PLL at a fourth falling edge of the reference clock signal, forcing the PFD outputs to be zero, operation 811; releasing the reset signal of the spread address counter at the fourth falling edge of the reference clock, operation 812; and incrementing the spread address counter by one on a second rising edge of the overflow bit signal of the first counter, operation 813.

In one embodiment, the plurality of offset values substantially form an inverted triangular spread pattern in the output reference signal. In another embodiment, the plurality of offset values substantially form an inverted Lexmark spread pattern in the output reference signal. Alternatively, the plurality of offset values substantially may form other spread patterns known by those of ordinary skill in the art for the spreading profile.

In another embodiment, method 800 may further include the operations of detecting an initial state of a spread address counter before synchronously opening the PLL, operation 604, and loading a first counter with a spread profile, where the spread profile causes an initial negative frequency slope in the output reference signal, operation 605. Alternatively, method 800 may further include the operations of detecting an initial state of a spread address counter before synchronously opening the PLL, operation 604; loading a base value into the first counter after synchronously opening the PLL, operation 701; adding a first offset value of a plurality of offset values to the base value, where the first offset value decreases a frequency of the output reference signal, operation 702; loading the first added value into the first counter, operation 703; adding a second offset value of the plurality of offset values to the base value, where the second offset value decreases the frequency of the output reference signal, operation 704; and loading the second added value into the first counter after incrementing spread address counter, operation 705.

It should be noted that the foregoing description of methods 600, 700, and 800 are exemplary embodiments. Various operations of these methods are sometimes grouped together in single embodiment, figure, or description thereof for the purpose of streamlining the disclosure aiding in the understanding of one or more of the various inventive aspects. This method of disclosure, however, is not to be interpreted as being restrictive or limiting to the combinations available of performing the above-described operations. For example, some operations may be performed simultaneously, others may be performed subsequently, and others may be performed synchronously.

In one exemplary embodiment, the improved algorithm, implemented as a circuit, as described with respect to FIGS. 2-5 may perform the following method. The method may include sampling an input communications enable signal, spread spectrum enable signal 213 (e.g., SS_EN) by a reference clock, input reference signal $F_{REF}$ 211, using flip-flop 501, in a first operation. In a second operation, at the second falling edge of the input reference signal $F_{REF}$ signal 211, the PFD control signal 216 (e.g., TRI_PFD) is activated (e.g., tri-stated), which results in opening the PLL synthesizer 200. In addition, in the second operation, the spread spectrum address counter 430 is reset, by activating the address counter reset signal 402 (e.g., R_ADDRCNT=L). In other words, the assertion of the address counter reset signal 402 (e.g., R_ADDRCNT) holds the spread address counter 430 at zero state. In a third operation, on the next rising edge of input reference signal $F_{REF}$ signal 211 activates the divider control signal 321 (e.g., SS_M/N_EN) from the second sampling flip-flop 502, to load the N-counter 212 with a first base value and the M-counter 202 with a first base value while the PLL synthesizer 200 is open (e.g., tri-stated). In addition, in the third operation, the signal SPREADING 405 goes High (buffered signal from the spread spectrum enable signal 213), enabling spread gates in the spread ROM 320; and the first counter reset signal 316 (e.g., RNB) goes Low, activating the reset in the first counter, N-counter 212. In other words, the assertion of the first counter reset signal 316 (e.g., RNB) holds the N-counter 212 at zero state.

In a fourth operation, on the next falling edge of the input reference signal $F_{REF}$ signal 211, the second counter reset signal 315 (e.g., RMB) is activated by going low. In other words, the assertion of the second counter reset signal 315 (e.g., RMB) holds the M-counter 202 at zero state. In a fifth operation, on the next rising edge of the input reference signal $F_{REF}$ 211, the first counter reset signal 316 (e.g., RNB) of first counter 212 is released and N-counter 212 starts counting. In other words, N-counter 212 is loaded with a base value when RNB 316 is de-asserted. In a sixth operation, the spread-control circuit 220 waits for a rising edge of an overflow bit signal FV 401 of N-counter 212. The overflow bit signal FV 401 is the feedback sign from the output of the N-counter 212 to the PFD/CP 204.

In a seventh operation, on the next rising edge of overflow bit signal FV 401, the second counter reset signal 315 (e.g., RMB) is released from the M-counter 202, and M-counter 202 starts counting. In other words, M-counter 202 is loaded with a base value when RMB 315 is de-asserted. By releasing the second counter reset signal 315 when receiving the overflow bit signal FV 401 from the N-counter 212, the phase of the output signal of the M-counter 202 and the phase of the output signal of the N-counter 212 are substantially aligned. In an eighth operation, on the next falling edge of the input reference signal $F_{REF}$ 211, the PFD control signal 216 (e.g., TRI_PFD) goes Low, closing the PLL. In addition, in the eight operation, the address counter reset signal 402 (e.g., R_ADDRCNT) is released from the spread address counter 430 and address counter reset signal 402 (e.g., R_ADDRCNT) goes high. In a ninth operation, on the next rising edge of overflow bit signal FV 401, the spread address counter 430 is changed by one, starting the spread spectrum operation.

Figure 9:
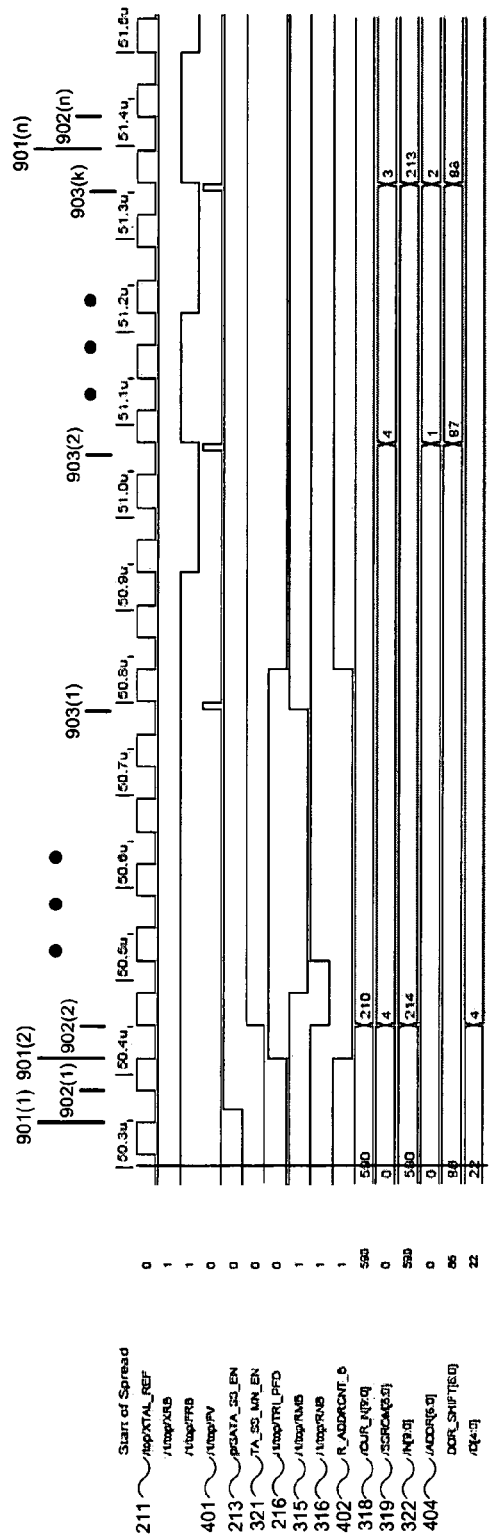
FIG. 9 illustrates a graph of an exemplary embodiment of logical waveforms representing the operation of the spread-control circuit when turning on the spread spectrum, determined by simulation.

FIG. 9 illustrates a graph of an exemplary embodiment of logical waveforms representing the operation of the spread-control circuit when turning on the spread spectrum, determined by simulation. The logical waveforms include the input and output signals of the following signals: input reference signal $F_{REF}$ 211, overflow bit FV 401, spread spectrum enable signal 213 (e.g., SS_EN), divider control signal 321 (e.g., SS_M/N_EN), PFD control signal 216 (e.g., TRI_PFD), first counter reset signal 316 (e.g., RNB), address counter reset signal 402 (e.g., R_ADDRCNT), one or more base values from configuration ROM 310 on line 318 (e.g., Cur_NDiv[m−1,0]), plurality of offset values from a spread ROM 320 on line 319 (e.g., N offeset[m−1,0]), the offset value added to the base value on line 322, and current address of the spread ROM 320 on line 404, as described with respect to FIGS. 2-5.

The graph of FIG. 9 includes the timing and sequence of the clocking events associated with the generation of the output control signals of the spread-control circuit 220 described with respect to the method 800 of FIG. 8. Input reference signal $F_{REF}$ 211, in this exemplary embodiment, is toggling at a frequency of 100 MHz. Input reference signal $F_{REF}$ 211 has a plurality of falling edges, 901(1)-901(n), and a plurality of rising edges 902(1)-902(n), where n is a positive integer. Overflow bit signal FV 401 includes a plurality of rising edges 903(1)-903(k), where k is a positive integer. In the previously described method, certain clocking events occur at the rising and falling edges of the input reference signal $F_{REF}$ 211, and the rising edges of the overflow bit signal FV 401.

In one exemplary embodiment, the following clocking events occur at the corresponding edges: sampling the spread enable signal 213 by a input reference signal $F_{REF}$ 211 at a first rising edge 902(1) by first sampling flip-flop 501; activating a PFD control signal 216 to open the PLL synthesizer 200 at a second falling edge 901(2) of the input reference signal $F_{REF}$ 211; activating a address counter reset signal 402 of the spread address counter 430 at the second falling edge 901(2) of the input reference signal $F_{REF}$ 211; the signal SPREADING 405, which is a buffered signal from the spread spectrum enable signal 213, goes High enabling spread gates in a spread ROM 320 including a spread profile on a third rising edge 902(3) of the input reference signal $F_{REF}$ 211; loading first base values into the N- and M-counters 212 and 202, respectively, on the third rising edge 902(3) of the input reference signal $F_{REF}$ 211; activating a first counter reset signal 316 of the N-counter 212 on the third rising edge 902(3) of the input reference signal $F_{REF}$ 211; activating a second counter rest signal 315 of the M-counter 202 on a third falling edge 901(3) of the input reference signal $F_{REF}$ 211; releasing the first counter reset signal 316 of the N-counter 212 on a fourth rising edge 902(4) of the input reference signal $F_{REF}$ 211; releasing the second counter reset signal of the M-counter 202 on a first rising edge 903(1) of an overflow bit signal FV 401 of the N-counter 212; deactivating the PFD control signal 216 to close the PLL synthesizer 200 at a fourth falling edge 901(4) of the input reference signal $F_{REF}$ 211; releasing the address counter reset signal 402 of the spread address counter 430 at the fourth falling edge 901(4) of the input reference signal $F_{REF}$ 211; and incrementing the spread address counter 430 by 1 on a second rising edge 903(2) of the overflow bit signal FV 401 of the N-counter 212.

In another exemplary embodiment, the following clocking events occur at the corresponding edges: detecting an initial state of a spread address counter 430 at a first rising edge 902(1) of the input reference signal $F_{REF}$ 211; loading a base value on line 318 into the N-counter 212 at a second rising edge 902(2), after synchronously opening the PLL synthesizer 200 at the second falling edge 901(2); adding a first offset value on line 319 of a plurality of offset values to the base value on line 318 at the second falling edge 901(2); loading the first added value on line 322 into the N-counter 212 at a third rising edge 902(3); adding a second offset value on line 319 of the plurality of offset values to the base value on line 318 at a second rising edge 903(2) of the overflow bit signal FV 401; and loading the second added value on line 322 into the N-counter 212 after incrementing spread address counter 430 by 1 at the second rising edge 903(2) of the overflow bit signal FV 401. In one embodiment, the first added value on line 322 causes the output reference signal on line 221 of the VCO 208 to decrease in frequency, or in other words, to have an initial negative frequency slope after detecting the initial state of the spread address counter 430. The initial negative frequency slope may be part of a spreading profile causing an inverted triangular spread pattern in the output reference signal. Alternatively, the initial negative frequency slope may be part of a spreading profile causing an inverted Lexmark spread pattern in the output reference signal.

Figure 10:
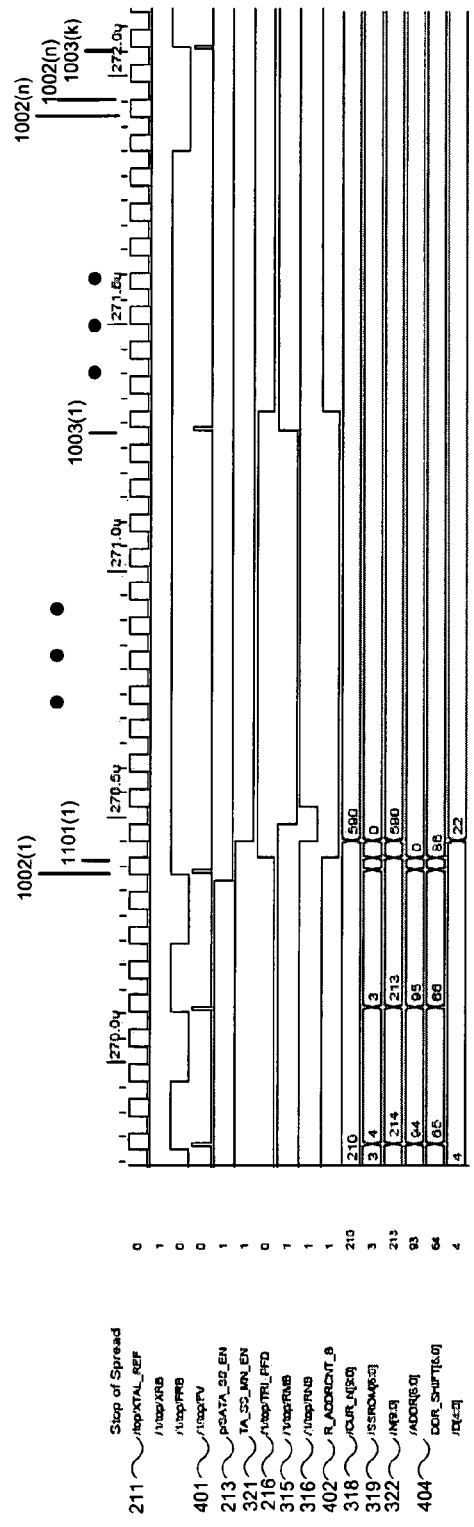
FIG. 10 illustrates a graph of an exemplary embodiment of logical waveforms representing the operation of the spread-control circuit when turning off the spread spectrum, determined by simulation.

FIG. 10 illustrates a graph of an exemplary embodiment of logical waveforms representing the operation of the spread-control circuit when turning off the spread spectrum, determined by simulation. The logical waveforms include the input and output signals of the following signals: input reference signal $F_{REF}$ 211, overflow bit FV 401, spread spectrum enable signal 213 (e.g., SS_EN), divider control signal 321 (e.g., SS_M/N_EN), PFD control signal 216 (e.g., TRI_PFD), first counter reset signal 316 (e.g., RNB), address counter reset signal 402 (e.g., R_ADDRCNT), one or more base values from configuration ROM 310 on line 318 (e.g., Cur_NDiv[m−1,0]), plurality of offset values from a spread ROM 320 on line 319 (e.g., N offeset[m−1,0]), the offset value added to the base value on line 322, and current address of the spread ROM 320 on line 404, as described with respect to FIGS. 2-5.

The graph of FIG. 10 includes the timing and sequence of the clocking events associated with the generation of the output control signals of the spread-control circuit 220 when turning the spread spectrum off. Input reference signal $F_{REF}$ 211, in this exemplary embodiment, is toggling at a frequency of 100 MHz. Input reference signal $F_{REF}$ 211 has a plurality of falling edges, 1001(1)-1001(n), and a plurality of rising edges 1002(1)-1002(n), where n is a positive integer. Overflow bit signal FV 401 includes a plurality of rising edges 1003(1)-1003(k), where k is a positive integer.

In one exemplary embodiment, the following clocking events occur at the corresponding edges: de-asserting the spread enable signal 213; sampling the spread enable signal 213 by the input reference signal $F_{REF}$ 211 at a first rising edge 1002(1) by first sampling flip-flop 501; activating a PFD control signal 216 to open the PLL synthesizer 200 at a first falling edge 1001(1) of the input reference signal $F_{REF}$ 211; deactivating an address counter reset signal 402 of the spread address counter 430 at the first falling edge 1001(1) of the input reference signal $F_{REF}$ 211; the signal SPREADING 405, which is the buffered signal from the spread spectrum enable signal 213, goes Low disenabling spread gates in the spread ROM 320 including the spread profile on a second rising edge 1002(2) of the input reference signal $F_{REF}$ 211; de-asserting divider control signal 321 (e.g., SS_M/N_EN) on a second rising edge 1002(2) of the input reference signal $F_{REF}$ 211; activating the first counter reset signal 316 of the N-counter 212 on the second rising edge 1002(2) of the input reference signal $F_{REF}$ 211; activating the second counter rest signal 315 of the M-counter 202 on a second falling edge 1001(2) of the input reference signal $F_{REF}$ 211; releasing the first counter reset signal 316 of the N-counter 212 on a third rising edge 1002(3) of the input reference signal $F_{REF}$ 211; releasing the second counter reset signal of the M-counter 202 on a first rising edge 1003(1) of an overflow bit signal FV 401 of the N-counter 212; deactivating the PFD control signal 216 to close the PLL synthesizer 200 at a fourteenth falling edge 901(14) of the input reference signal $F_{REF}$ 211; and releasing the address counter reset signal 402 of the spread address counter 430 at the fourteenth falling edge 901(14) of the input reference signal $F_{REF}$ 211.

Figure 11A:
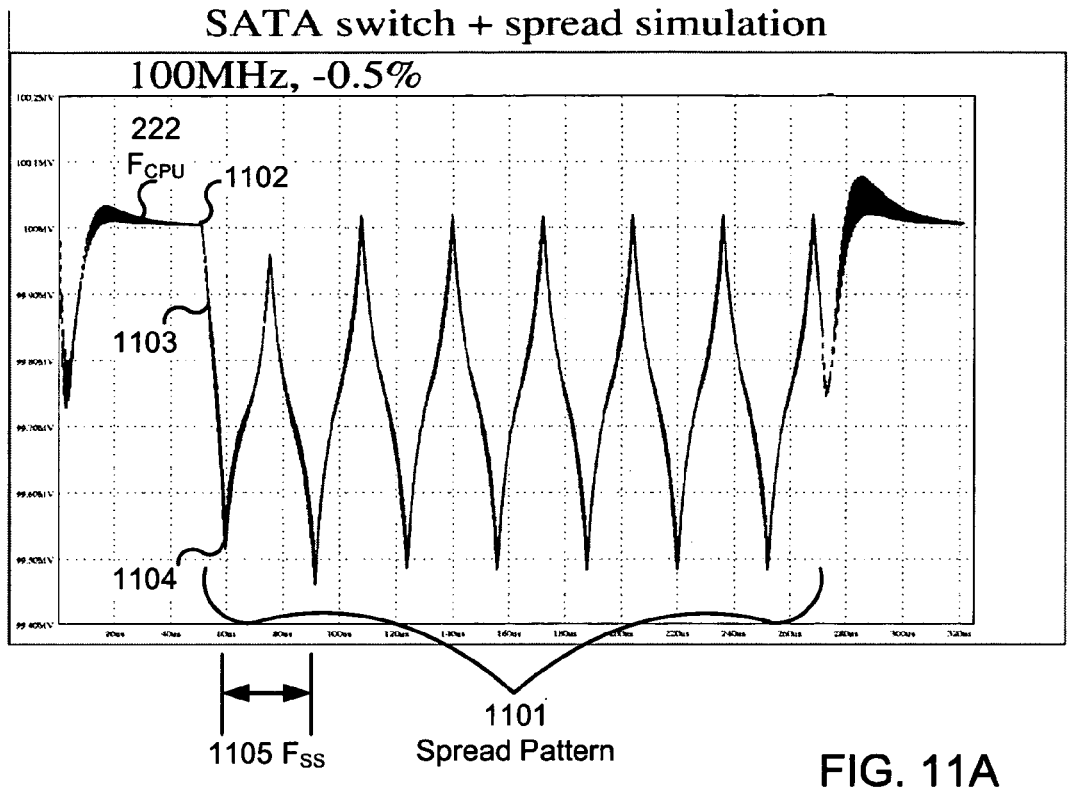
FIG. 11A illustrates an analog waveform of an exemplary embodiment of an output reference signal of the PLL synthesizer, having a spread spectrum pattern of negative 0.5% down-spread at 100 MHz.

FIG. 11A illustrates an analog waveform of an exemplary embodiment of an output reference signal of the PLL synthesizer, having a spread spectrum pattern of negative 0.5% down-spread at 100 MHz. The spread pattern 1101 of output reference signal $F_{CPU}$ 222 is an inverted Lexmark spread pattern. The inverted Lexmark spread pattern is created by loading a spreading profile, including a plurality of offset values, from the spread ROM 320 into the N-counter 212. The plurality of offset values are added to a base value received from the configuration ROM 310 to be loaded in the N-counter 212.

As previously described, the input reference signal $F_{REF}$ 211 is divided by the value of M-counter 202 on line 218 before feeding the frequency into PFD/CP 204. Through the PFD/CP 204, the LF 206, and VCO 208, the frequency is multiplied by the value of the N-counter 212 on line 219. The output reference signal $F_{CPU}$ 222 is taken from the VCO 208 on line 221 after being divided by the value in F-counter 210. In this exemplary embodiment, the first offset value of the plurality of offset values of the spreading profile is added to the base value of the configuration ROM 310. The first added value is loaded into N-counter 212, causing the output reference signal $F_{CPU}$ 222 to have an initial negative frequency slope 1103 starting from point 1102 to point 1104 after detecting the initial state of the spread address counter 430. In other words, the output reference signal $F_{CPU}$ 222 when the first added value is loaded into the N-counter 212 is less than the output reference signal $F_{CPU}$ 222 when the base value is loaded into the N-counter 212. The spreading profile of the spread ROM 320 is repetitively loaded into the N-counter 212 at a spread frequency $F_{SS}$ 1105. In this embodiment, the spread frequency $F_{SS}$ 1105 is approximately 33 kHz. Alternatively, other spread frequencies may be used as known by those of ordinary skill in the art.

The spread frequency is determined by the number of rows of the spread ROM 320. In one exemplary embodiment, if the frequency $F_N$ of the output signal of the N-counter 212 were approximately 4 MHz and the number of rows (e.g., # of Rows) of the spread ROM 320 were 120, then the spread frequency would be approximately 33 kHz. This calculation can be express in the following equation:

$$F_{SS}=(F_N)/(\#ofRows)$$

The plurality of offset values are stored in the number of rows and are sequentially read out to be added to the base value to be loaded into the N-counter 212.

Since the spreading profile of the spread ROM 320 causes the output reference signal $F_{CPU}$ 222 to be at the downward trend, as illustrated in the initial negative frequency slope 1103 of FIG. 11A, the overshoot in the output reference signal $F_{CPU}$ 222 is eliminated or limited, when turning on the spread spectrum of the output reference signal $F_{CPU}$ 222.

In an alternative embodiment, the overshoot in the output reference signal $F_{CPU}$ 222 may be substantially eliminated or limited, when turning on the spread spectrum of the output reference signal $F_{CPU}$ 222 by, first, detecting an initial state or zero count of the spread address counter 430, and second, loading the N-counter 212 with a spread profile, where the spread profile causes an initial negative frequency slope in the output reference signal $F_{CPU}$ 222.

Because the M- and N-counters 202 and 212 are synchronously loaded while the PLL loop is open, the PLL synthesizer 200 will not be abruptly react to the counter value changes. This may limit both the undershoot and overshoot in the output reference signal $F_{CPU}$ 222. In an alternative embodiment, the phase alignment of the output signals of the M- and N-counters 202 and 212 prior to closing the PLL loop substantially eliminates or limits the undershoot of the output reference signal $F_{CPU}$ 222, while turning on the spread function.

Figure 11B:
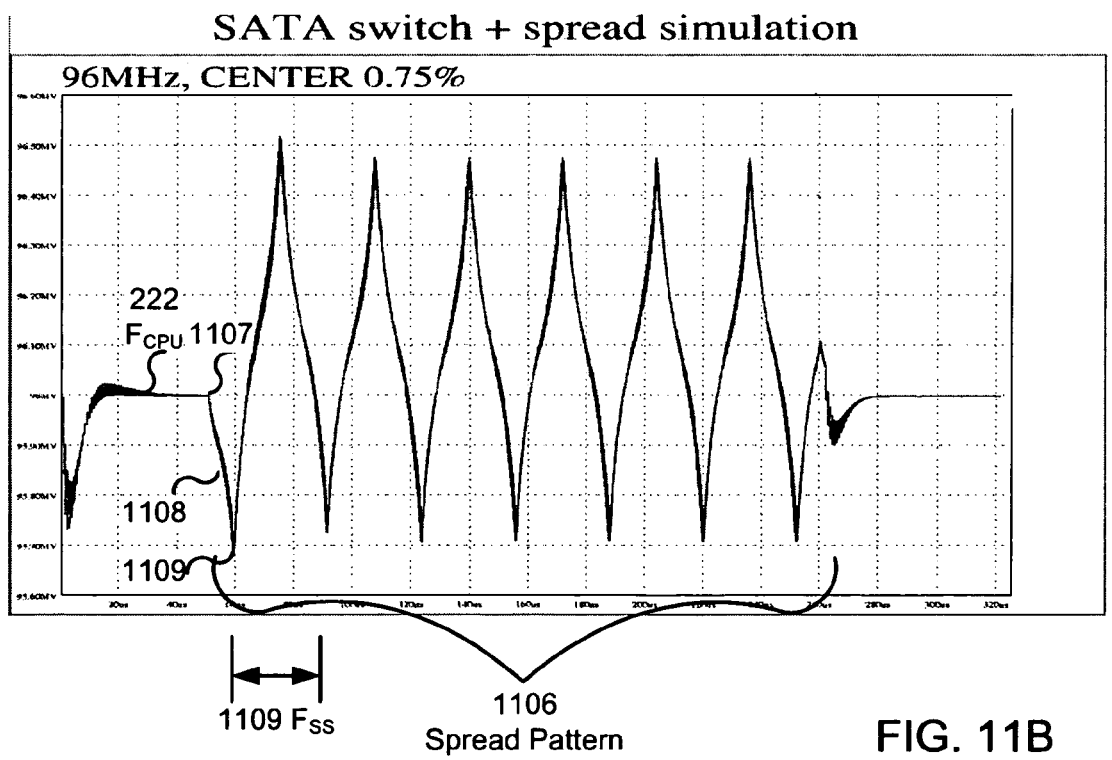
FIG. 11B illustrates an analog waveform of an exemplary embodiment of an output reference signal of the PLL synthesizer, having a spread spectrum pattern of negative 0.75% center-spread at 96 MHz.

FIG. 11B illustrates an analog waveform of an exemplary embodiment of an output reference signal of the PLL synthesizer, having a spread spectrum pattern of negative 0.75% center-spread at 96 MHz. The spread pattern 1106 of output reference signal $F_{CPU}$ 222 is an inverted Lexmark spread pattern. As previously described with respect to FIG. 11A, the inverted Lexmark spread pattern is created by loading a spreading profile, including a plurality of offset values, from the spread ROM 320 into the N-counter 212. The plurality of offset values are added to a base value received from the configuration ROM 310 to be loaded in the N-counter 212.

In this exemplary embodiment, the first offset value of the plurality of offset values of the spreading profile is added to the base value of the configuration ROM 310. The first added value is loaded into N-counter 212, causing the output reference signal $F_{CPU}$ 222 to have an initial negative frequency slope 1108 starting from point 1107 to point 1109 after detecting the initial state of the spread address counter 430. In other words, the output reference signal $F_{CPU}$ 222 when the first added value is loaded into the N-counter 212 is less than the output reference signal $F_{CPU}$ 222 when the base value is loaded into the N-counter 212. The spreading profile of the spread ROM 320 is repetitively loaded into the N-counter 212 at a spread frequency $F_{SS}$ 1105. In this embodiment, the spread frequency $F_{SS}$ 1109 is approximately 33 kHz. Alternatively, other spread frequencies may be used as known by those of ordinary skill in the art.

Since the spreading profile of the spread ROM 320 causes the output reference signal $F_{CPU}$ 222 to be at the downward trend, as illustrated in the initial negative frequency slope 1108 of FIG. 11B, the overshoot in the output reference signal $F_{CPU}$ 222 is eliminated or limited, when turning on the spread spectrum of the output reference signal $F_{CPU}$ 222.

In an alternative embodiment, the overshoot in the output reference signal $F_{CPU}$ 222 may be substantially eliminated or limited, when turning on the spread spectrum of the output reference signal $F_{CPU}$ 222 by, first, detecting an initial state or zero count of the spread address counter 430, and second, loading the N-counter 212 with a spread profile, where the spread profile causes an initial negative frequency slope in the output reference signal $F_{CPU}$ 222.

Because the M- and N-counters 202 and 212 are synchronously loaded while the PLL loop is open, the PLL synthesizer 200 will not be abruptly react to the counter value changes. This may limit both the undershoot and overshoot in the output reference signal $F_{CPU}$ 222. In an alternative embodiment, the phase alignment of the output signals of the M- and N-counters 202 and 212 prior to closing the PLL loop substantially eliminates or limits the undershoot of the output reference signal $F_{CPU}$ 222 while turning on the spread function.

Figure 12A:
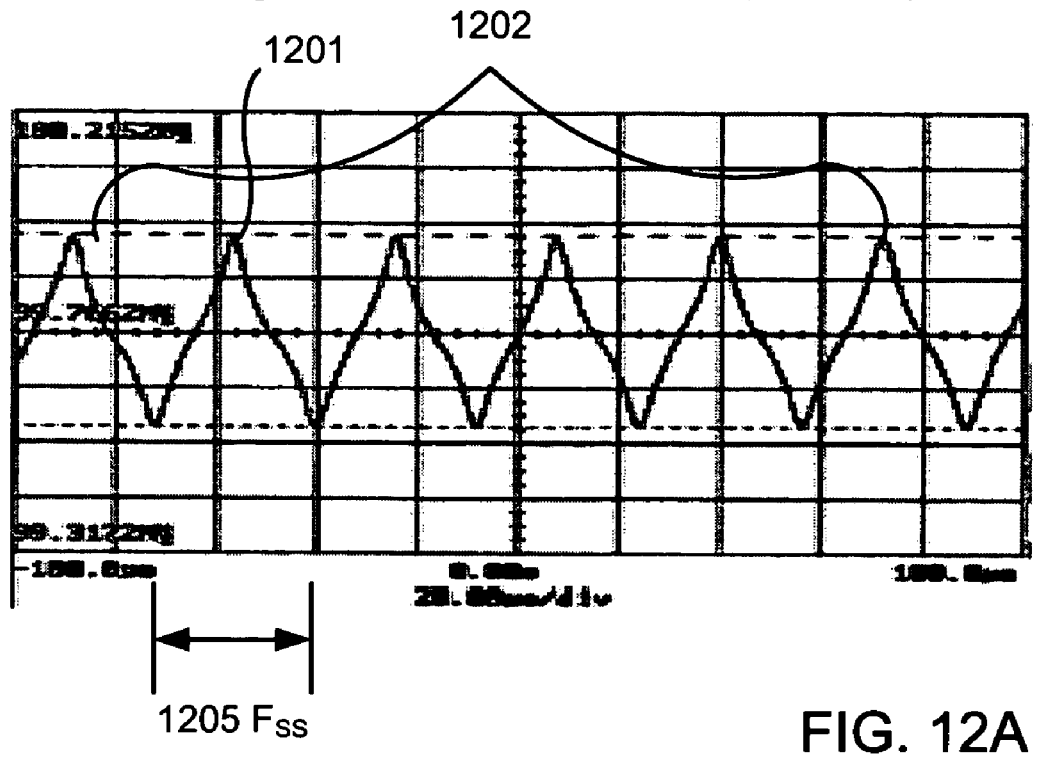
FIG. 12A illustrates a graph of one exemplary embodiment of a CPU clock signal output from the PLL synthesizer using the spread-control circuit to apply a negative 0.5% down-spread.

FIG. 12A illustrates a graph of one exemplary embodiment of a CPU clock signal output from the PLL synthesizer using the spread-control circuit to apply a negative 0.5% down-spread. The graph of FIG. 12A includes CPU clock signal 1201, which is the output reference signal $F_{CPU}$ 222 of PLL synthesizer 200, as previously described. CPU clock signal 1201 has a center frequency of 100 MHz and a negative 0.5% down-spread is applied, forming an inverted Lexmark spread pattern in CPU clock signal 1201. In this embodiment, the spread frequency $F_{SS}$ 1205 is approximately 33 kHz. Alternatively, other spread frequencies may be used as known by those of ordinary skill in the art.

As previously described, reference signals, such as clock signals, may generate radiation spikes in the fundamental frequency as well as the harmonic frequencies. By applying a spread spectrum to the input reference signal, energies of the input reference signal can be spread out by modulating the input reference signal with a slower frequency, a spread frequency, such as spread frequency $F_{SS}$ 1205 of FIG. 12A. In other words, the spreading of the input reference signal over a narrow band of frequency reduces the peak EMI in the fundamental frequency, as illustrated in FIG. 12B, and in the harmonic frequencies, such as the $5^{th}$ and $7^{th}$ harmonic frequencies, as illustrated in FIGS. 12C and 12D, respectively.

In this exemplary embodiment of FIG. 12 A, an inverted Lexmark spread pattern 1202 is applied to a 100 MHz clock signal, resulting in the CPU clock signal 1201 of 100 MHz signal being modulated with spread frequency 1205, 33 kHz. In order to modulate the input reference signal by the spread frequency 1205, a spread profile, which is stored in a spread ROM, contains values that change the value of the M/N divider (e.g., the values contained in the M- and N-counters 202 and 212 that determines the how the input reference signal is multiplied and divided to generate the output reference signal.)

In this embodiment, the spread profile is a down-spread of negative 0.5%. The negative 0.5% value is the amount of spread that is applied to the input reference signal. A down-spread of negative 0.5% results in an output frequency of 100 MHz, having peaks values at 100 MHz and 99.5 MHz (i.e., 100 Mhz−((0.5%)*(100 MHz)=99.5 MHz). It should be noted that in this example, the resulting waveform of the output reference signal (e.g., inverted Lexmark spread pattern) will start at 100 MHz and decrease in frequency down to the first peak value of 99.5 MHz at the bottom of a first pulse of the resulting waveform, and then increase in frequency up to a second peak value of 100 MHz, and decrease back down to a third peak value of 99.5 MHz of a second pulse, repeating as long as the spread spectrum is turned on. The frequency between the first peak value and the third peak value is the spread frequency 1205 (e.g., 33 kHz).

Figure 12B:
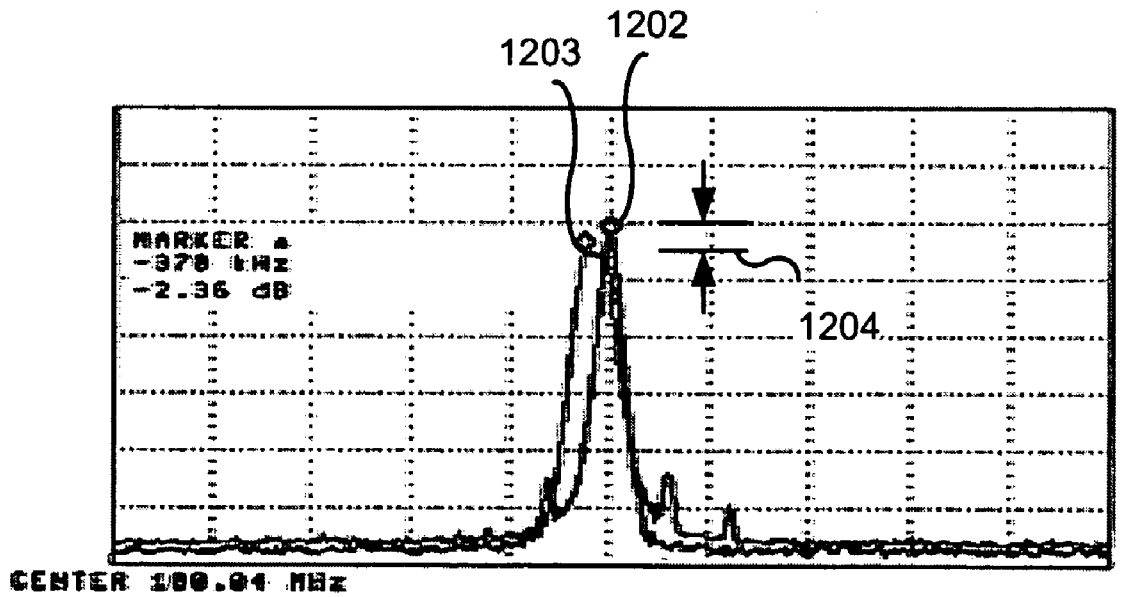
FIG. 12B illustrates a graph of an EMI reduction at the fundamental frequency of the output reference signal of FIG. 12A.
Figure 12C:
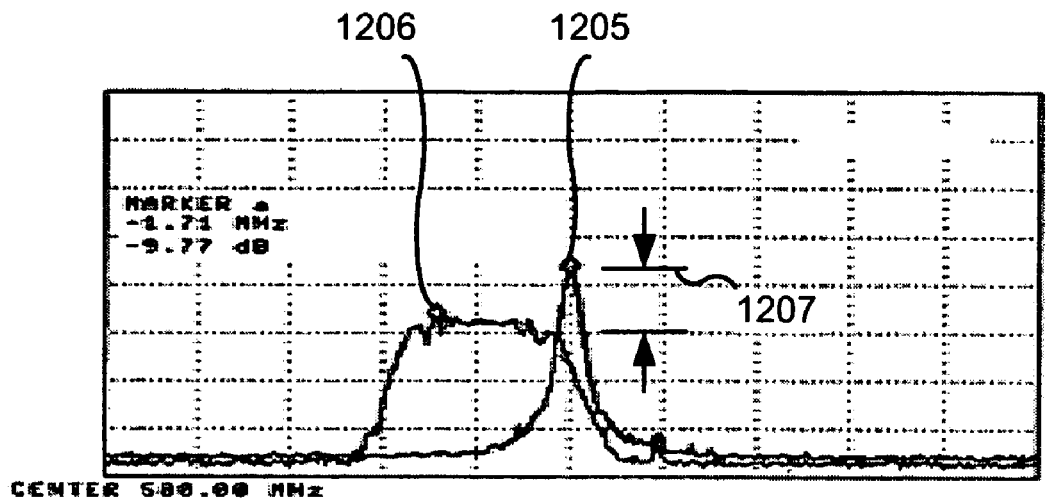
FIG. 12C illustrates a graph of an EMI reduction at the fifth harmonic frequency of the output reference signal of FIG. 12A.
Figure 12D:
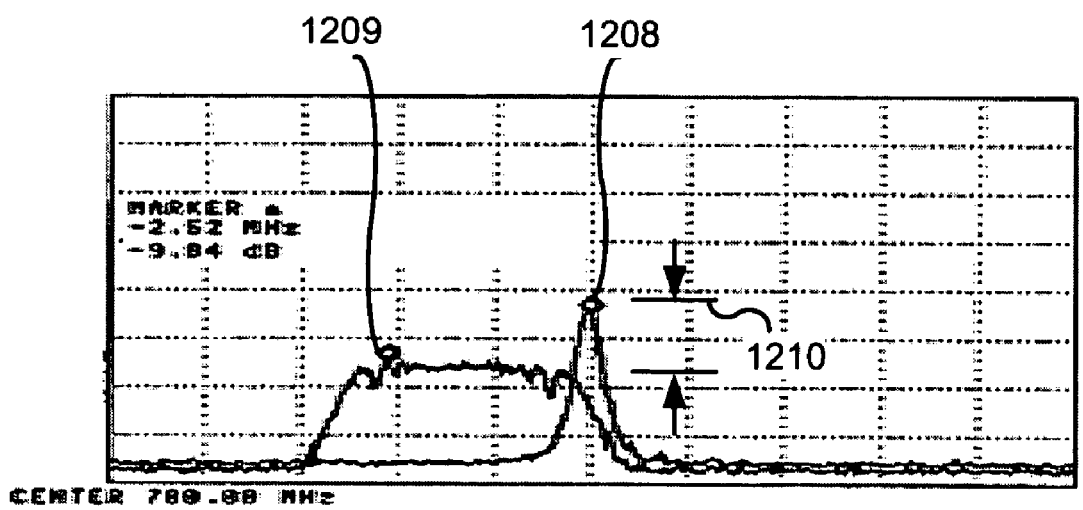
FIG. 12D illustrates a graph of an EMI reduction at the seventh harmonic frequency of the output reference signal of FIG. 12A.

FIG. 12B illustrates a graph of an EMI reduction at the fundamental frequency of the output reference signal of FIG. 12A. As previously described, in the exemplary embodiment of FIG. 12A, the spread-spectrum circuit 220 may be used to reduce the peak energy in the CPU clock signal 1201 at the fundamental and harmonic frequencies. The graph of 12B illustrates CPU clock signal while applying spread 1203 and CPU clock signal while not applying spread 1202 at the fundamental frequency of 100 MHz. As illustrated in FIG. 12B, at the fundamental frequency, the peak EMI reduction is approximately −2.36 dB, EMI reduction 1204.

FIG. 12C illustrates a graph of an EMI reduction at the fifth harmonic frequency of the output reference signal of FIG. 12A. The graph of 12C illustrates CPU clock signal while applying spread 1206 and CPU clock signal while not applying spread 1205 at the $5^{th}$ harmonic frequency of 500 MHz. As illustrated in FIG. 12C, at the $5^{th}$ harmonic frequency of 500 MHz, the peak EMI reduction is approximately −9.77 dB, EMI reduction 1207.

FIG. 12D illustrates a graph of an EMI reduction at the seventh harmonic frequency of the output reference signal of FIG. 12A. The graph of 12D illustrates CPU clock signal while applying spread 1209 and CPU clock signal while not applying spread 1209 at the $7^{th}$ harmonic frequency of 700 MHz. As illustrated in FIG. 12D, at the $7^{th}$ harmonic frequency of 700 MHz, the peak EMI reduction is approximately −9.84 dB, EMI reduction 1210.

In another exemplary embodiment, the spread profile is a down-spread of negative 1.0%, resulting in peak EMI reductions of approximately −4.97 dB at the fundamental frequency, approximately −12.94 dB at the fifth harmonic frequency, and approximately −13.72 dB at the seventh harmonic frequency.

Embodiments of the present invention are well suited to performing various other operations or variations of the operations recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the spread-control circuit 220 and the methods of designing and manufacturing the same that are widely known and are not relevant to the present embodiments have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment.

Furthermore, the particular features, structures, or characteristics may be combined as suitable in one or more embodiments of the invention.

Similarly, it should be appreciated that in the foregoing description of exemplary embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed embodiments requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
turning on a spread spectrum of an output reference signal in a phase-locked loop (PLL); and
limiting an overshoot in the output reference signal when turning on the spread spectrum, wherein limiting the overshoot comprises:
detecting an initial state of a spread address counter; and
loading a first counter of the PLL with a spread profile, the spread profile to cause an initial negative frequency slope in the output reference signal.

2. The method of claim 1, wherein the output reference signal is a clock signal.

3. The method of claim 1, wherein loading the first counter with the spread profile comprises:
loading a base value into the first counter after synchronously opening the PLL;
adding a first offset value of a plurality of offset values to the base value, the first offset value to decrease a frequency of the output reference signal;
loading the first added value into the first counter;
adding a second offset value of the plurality of offset values to the base value, the second offset value to decrease the frequency of the output reference signal; and
loading the second added value into the first counter after incrementing spread address counter.

4. The method of claim 3, wherein the plurality of offset values substantially form an inverted triangular spread pattern in the output reference signal.

5. The method of claim 3, wherein the plurality of offset values substantially form an inverted Lexmark spread pattern in the output reference signal.

6. The method of claim 1, wherein limiting the overshoot comprises limiting the overshoot to be less than approximately 0.03% of the output reference signal.

7. The method of claim 1, wherein limiting the overshoot comprises limiting the overshoot to achieve substantially no overshoot.

8. A method, comprising:
turning on a spread spectrum of an output reference signal in a phase-locked loop (PLL); and
limiting an undershoot in the output reference signal when turning on the spread spectrum, wherein limiting the undershoot comprises:
synchronously opening the PLL;
synchronously loading a first counter and a second counter of the PLL;
aligning a phase of an output signal of the first counter with a phase of an output signal of the second counter; and
synchronously closing the PLL and incrementing a spread address counter.

9. The method of claim 8, wherein the output reference signal is a clock signal.

10. The method of claim 8, wherein synchronously opening the PLL comprises:
detecting a spread enable signal from a serial interface;
sampling the spread enable signal by a reference clock signal at a first rising edge; and
activating a PFD control signal to open the PLL at a second falling edge of the reference clock signal.

11. The method of claim 10, wherein synchronously loading the first counter and the second counter comprises:
activating a reset signal of the spread address counter at the second falling edge of the reference clock signal;
enabling spread gates in a spread ROM including a spread profile on a third rising edge of the reference clock signal; and
loading first base values into the first and second counters on the third rising edge of the reference clock signal.

12. The method of claim 11, wherein aligning the phase of the output signal of the first counter with the phase of the output signal of the second counter comprises:
activating a reset signal of the first counter on the third rising edge of the reference clock signal;
activating a rest signal of the second counter on a third falling edge of the reference clock signal;
releasing the reset signal of the first counter on a fourth rising edge of the reference clock signal; and
releasing the reset signal of the second counter on a first rising edge of an overflow bit signal of the first counter.

13. The method of claim 12, wherein synchronously closing the PLL and activating the spread address counter comprises:
deactivating the PFD control signal to close the PLL at a fourth falling edge of the reference clock signal;
releasing the reset signal of the spread address counter at the fourth falling edge of the reference clock; and
incrementing the spread address counter by 1 on a second rising edge of the overflow bit signal of the first counter.

14. The method of claim 8, further comprising detecting an initial state of a spread address counter before synchronously opening the PLL.

15. The method of claim 8, further comprising:
loading a base value into the first counter after synchronously opening the PLL;
adding a first offset value of a plurality of offset values to the base value, the first offset value to decrease a frequency of the output reference signal;
loading the first added value into the first counter;
adding a second offset value of the plurality of offset values to the base value, the second offset value to decrease the frequency of the output reference signal; and
loading the second added value into the first counter after incrementing spread address counter.

16. The method of claim 15, wherein the plurality of offset values substantially form an inverted triangular spread pattern in the output reference signal.

17. The method of claim 15, wherein the plurality of offset values substantially form an inverted Lexmark spread pattern in the output reference signal.

18. The method of claim 8, wherein limiting the undershoot comprises limiting the undershoot to be less than approximately negative 0.03% of the output reference signal.

19. The method of claim 8, wherein limiting the undershoot comprises limiting the undershoot to achieve substantially no undershoot.

20. An apparatus, comprising:
a phase-locked loop (PLL); and
a spread-control circuit coupled to the PLL, the spread spectrum switch to limit an overshoot and an undershoot in an output reference signal; wherein the spread-control circuit is configured to load a first counter of the PLL with a spread profile, the spread profile to cause an initial negative frequency slope in the output reference signal to limit the overshoot, wherein the spread-control circuit comprises:
a spread spectrum switch coupled to the PLL, the spread spectrum comprises a first, second, and third sampling flip-flops clocked by a crystal oscillator signal, the first, second, and third sampling flip-flops to sample an input spread spectrum enable signal, the first, second, and third sampling flip-flops configured to provide a plurality of control output signals;
a spread address counter coupled to the spread spectrum switch;
an adder to receive a first base value and a plurality of offset values of a spreading profile; and
a multiplexer coupled to an output of the adder, the multiplexer to receive the first base value and the added value from the adder.

21. The apparatus of claim 20, wherein the PLL comprises:
a first counter coupled to the spread-control circuit, first counter to receive at least one of the first base value and the added value from the multiplexer;
a phase frequency detector and charge pump (PFD/CP) coupled to the first counter and the spread-control circuit;
a voltage control oscillator (VCO) coupled PFD/CP and the first counter, the VCO to generate an output reference signal; and
a second counter coupled to the PFD/CP and the spread-control circuit, the second counter to receive an input reference signal, wherein the input frequency is divided by a second base value of the second counter and multiplied by at least one of the first base value and the added value of the first counter.

22. The apparatus of claim 21, further comprising:
a configuration read only memory (ROM) coupled to the second counter and the adder of the spread-control circuit, the configuration ROM comprises the first and second base values of the first and second counters; and
a spread ROM coupled to the adder of the spread-control circuit, the spread ROM comprises the plurality of offset values of the spreading profile.

23. The apparatus of claim 20, wherein the plurality of control output signals comprise at least one of:
a phase frequency detector (PFD) control signal to open and close the PLL;
an address counter reset signal to activate and release the spread address counter;
a first counter reset signal to activate and release the first counter, the first counter to receive at least one of the base value and the added value from the multiplexer;
a second counter reset signal to activate and release the second counter, the second counter to receive the second base value; and
a divider control signal to load the first and second base values into the first and second counters.

24. The apparatus of claim 21, further comprising:
a loop filter coupled to the PFD/CP and the VCO; and
a third counter coupled to the VCO, wherein the output frequency is divided by a value of the third counter to produce a clock frequency signal.

* * * * *